(12) United States Patent
Han et al.

(10) Patent No.: US 10,475,611 B2
(45) Date of Patent: Nov. 12, 2019

(54) ACTUATOR FOR A SWITCHING DEVICE

(71) Applicant: SCHNEIDER ELECTRIC INDUSTRIES SAS, Rueil-Malmaison (FR)

(72) Inventors: Yong Heng Han, Singapore (SG); Quek Kee Meng, Singapore (SG); Wong Yoon Nam, Singapore (SG)

(73) Assignee: SCHNEIDER ELECTRIC LOGISTICS ASIA PTE LTD., Singapore (SG)

( * ) Notice: Subject to any disclaimer, the term of this patent is extended or adjusted under 35 U.S.C. 154(b) by 341 days.

(21) Appl. No.: 14/572,205

(22) Filed: Dec. 16, 2014

(65) Prior Publication Data

US 2015/0179377 A1 Jun. 25, 2015

(30) Foreign Application Priority Data

Dec. 19, 2013 (SG) ................. 201309411-5

(51) Int. Cl.
*H02J 1/00* (2006.01)
*H01H 11/00* (2006.01)
(Continued)

(52) U.S. Cl.
CPC ........ *H01H 47/002* (2013.01); *H01H 9/0271* (2013.01); *H01H 9/167* (2013.01); *H01H 23/14* (2013.01); *H01H 89/00* (2013.01); *G01R 31/025* (2013.01); *G01R 31/3278* (2013.01); *H01H 3/161* (2013.01); *H01H 9/16* (2013.01); *H01H 21/22* (2013.01); *H01H 2300/052* (2013.01); *Y10T 307/826* (2015.04)

(58) Field of Classification Search
CPC .... H01H 47/002; H01H 9/0271; H01H 9/167; H01H 23/14; H01H 89/00; H01H 3/161; H01H 9/16; H01H 21/22; G01R 31/025; G01R 31/3278
USPC .................................. 307/112–144
See application file for complete search history.

(56) References Cited

U.S. PATENT DOCUMENTS 4,584,856 A * 4/1986 Petersdorff ........... E05B 17/142
379/445
5,343,007 A * 8/1994 Roeser ................... H01H 23/06
200/296
(Continued)

FOREIGN PATENT DOCUMENTS

CN 101354974 A 1/2009

OTHER PUBLICATIONS

Chinese Office Action issued by the Chinese Patent Office corresponding to Chinese Application No. 201410797434.9 dated Dec. 30, 2016 [English Translation attached].
(Continued)

*Primary Examiner* — Brandon S Cole
(74) *Attorney, Agent, or Firm* — Lando & Anastasi, LLP

(57) ABSTRACT

A switching device and a method for switching states of a switching device are provided, the switching device comprising a housing; a switching module comprising a switching element, the switching module is configured to switch a state of the switching element upon generation of a switching signal; and an actuator for receiving a mechanical input and for facilitating generation of an electrical toggle signal, the toggle signal for causing the switching module to switch a state of the switching element.

30 Claims, 25 Drawing Sheets

(51) Int. Cl.
    *H01H 23/00*    (2006.01)
    *H01H 23/02*    (2006.01)
    *H02G 3/08*     (2006.01)
    *H04H 40/18*    (2008.01)
    *E02F 3/36*     (2006.01)
    *G01N 21/00*    (2006.01)
    *H01H 47/00*    (2006.01)
    *H01H 9/16*     (2006.01)
    *H01H 23/14*    (2006.01)
    *H01H 9/02*     (2006.01)
    *H01H 89/00*    (2006.01)
    *H01H 21/22*    (2006.01)
    *G01R 31/02*    (2006.01)
    *G01R 31/327*   (2006.01)
    *H01H 3/16*     (2006.01)

(56) References Cited

U.S. PATENT DOCUMENTS

| | | | | |
|---|---|---|---|---|
| 5,382,768 A | * | 1/1995 | Kurek | H01H 23/143 |
| | | | | 200/553 |
| 5,386,210 A | | 1/1995 | Lee | |
| 5,473,130 A | * | 12/1995 | Pudims | H01H 23/30 |
| | | | | 200/559 |
| 5,483,230 A | | 1/1996 | Mueller | |
| 5,697,079 A | * | 12/1997 | Spivey | H04H 40/18 |
| | | | | 348/632 |
| 5,950,812 A | * | 9/1999 | Tanacan | H01H 23/205 |
| | | | | 200/339 |
| 6,841,750 B2 | * | 1/2005 | Sasaki | H01H 23/162 |
| | | | | 200/339 |
| 7,148,434 B2 | * | 12/2006 | Chi | F16H 59/02 |
| | | | | 200/6 R |
| 8,696,991 B1 | * | 4/2014 | Howe | G01N 21/553 |
| | | | | 422/400 |
| 2002/0021226 A1 | | 2/2002 | Clement et al. | |
| 2009/0189542 A1 | | 7/2009 | Wu et al. | |
| 2010/0101924 A1 | | 4/2010 | Wu et al. | |
| 2011/0316655 A1 | * | 12/2011 | Mehraban | H01H 5/02 |
| | | | | 335/207 |
| 2013/0314237 A1 | | 11/2013 | Severac et al. | |

OTHER PUBLICATIONS

Extended European Search Report from corresponding European Application No. 14307010.0 dated May 20, 2015.
Second Chinese Office Action issued by the Chinese Patent Office corresponding to Chinese Application No. 201410797434.9 dated Sep. 20, 2017 [English Translation attached].
Third Chinese Office Action issued by the Chinese Patent Office corresponding to Chinese Application No. 201410797434.9 dated Apr. 10, 2018 [English Translation attached].

* cited by examiner

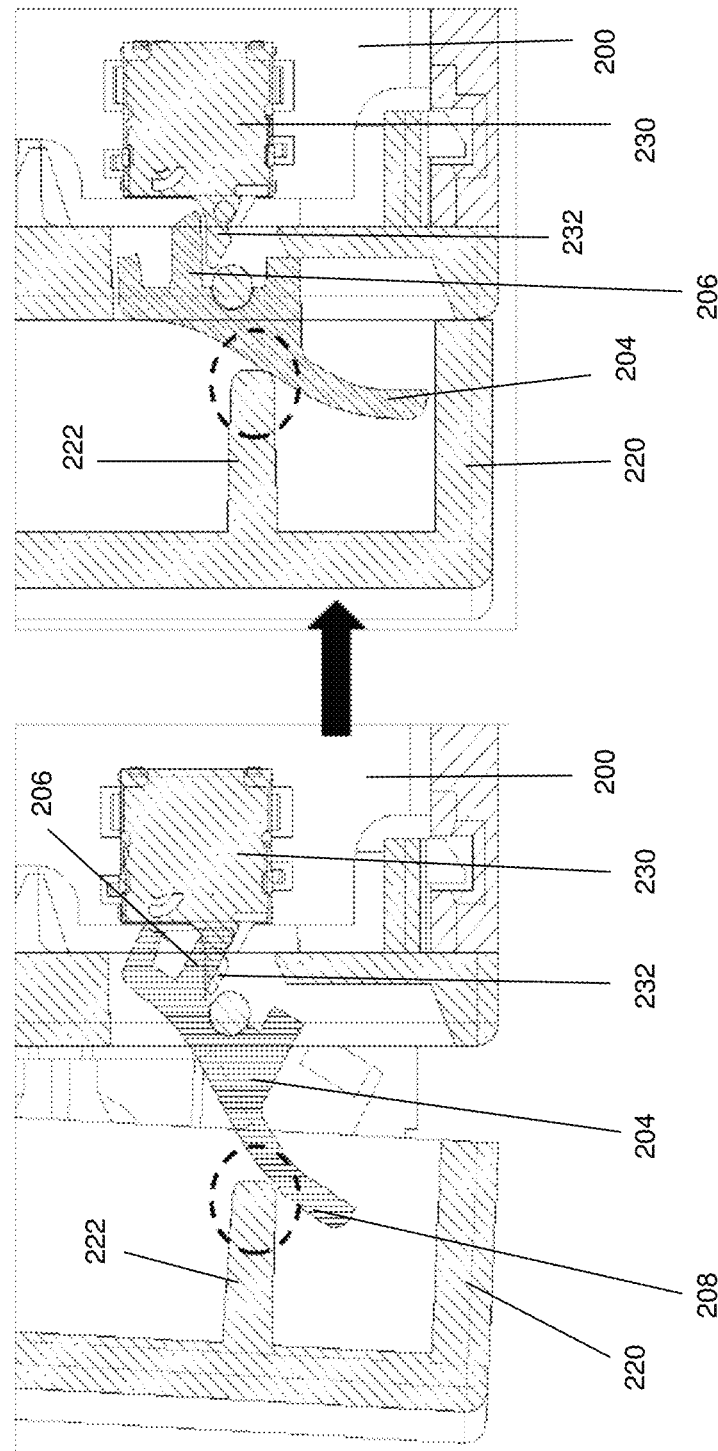

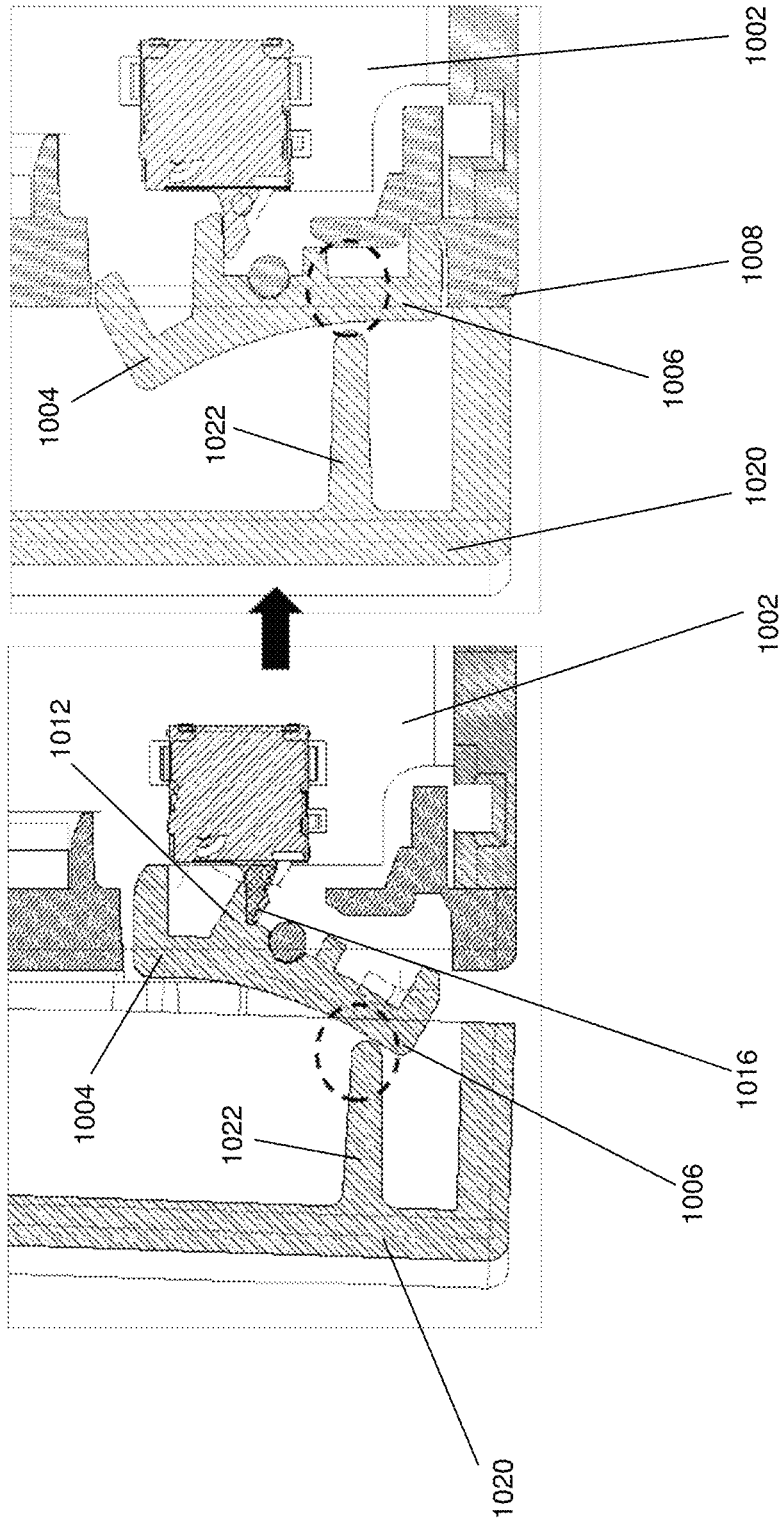

ACTUATOR FOR A SWITCHING DEVICE

CROSS REFERENCE TO RELATED APPLICATION

This application claims the benefit under 35 U.S.C. § 119 of Singapore Patent Application No. 201309411-5 filed on Dec. 19, 2013 which is hereby incorporated herein by reference in its entirety for all purposes.

TECHNICAL FIELD

The present disclosed technology relates broadly to a switching device and to a method for switching states of a switching device.

BACKGROUND

There has been an increase in the use of electronic relays to detect whether thresholds of specified input parameters, such as those for voltage levels, current levels, and liquid levels, are exceeded.

However, the process of troubleshooting or diagnosing a fault in a relay circuit/system is typically tedious and cumbersome due to the large number of electronic relays typically used in relay circuits.

Presently, a user needs to apply a trigger condition in order to determine whether the relay circuit/system is in working condition. That is, to check whether connectivity is working for an electronic relay to, for example, monitor overvoltage. The present method involves providing an actual overvoltage to the relay to determine whether the electronic relay is able to operate to switch states (i.e. when a predetermined threshold of a sensed input is reached), and whether the connected relay circuit/system is able to perform predetermined follow-up actions such as raising an alarm. Such types of testing may be potentially dangerous or hazardous since they may lead to power surges or accidents when providing inputs past thresholds.

Furthermore, there have been several instances when electronic relays are returned from users with "no fault found" symptoms. "No fault found" is typically known as the problem of an electronic relay circuit/system not being able to switch as it is meant to switch when a predetermined threshold of a sensed input or "fault" is reached.

For a present solid state relay, such as for a switch type connected at its input to an external relay controller (e.g. a temperature controller or a program logic controller (PLC)) and connected at its output to a circuit which the relay may be in turn controlling, an input light emitting diode (LED) indicator is typically used to indicate to a user whether the solid state relay is in a "switch to connect" or a "switch to disconnect" state. The circuit may comprise, for example, a transistor, MOSFET, thyristor, or TRIAC. The present method of checking whether a solid state relay is operating normally may only be done when the external relay controller is connected to an input of the solid state relay and the external relay controller is turned on and/or off to determine whether the switch trigger signal from turning on or off is correctly transmitted to a circuit connected at an output of the solid state relay. This form of checking may be undesirable because it may be tedious and relatively more time consuming to, for example, set up the relay controller at the input and the circuit at the output of the solid state relay.

It has been recognized that there is currently no functional test available for connectivity of an electronic relay or relay circuit/system before the electronic relay circuit/system is put into operation or usage. A user is not able to know the quality of connectivity of an electronic relay circuit/system unless the electronic relay circuit/system is put into use in an actual live circuit.

Therefore, there exists a need to provide a switching device and a method for switching states of a switching device that seek to address one or more of the problems above.

SUMMARY

In accordance with an aspect, there is provided a switching device, the switching device including a housing, a switching module including a switching element, the switching module being configured to switch a state of the switching element upon generation of a switching signal, and an actuator for receiving a mechanical input and for facilitating generation of an electrical toggle signal. The toggle signal may be used to cause the switching module to switch a state of the switching element.

The switching signal may be a condition trigger signal based on one or more predetermined conditions.

The toggle signal may be sent directly to the switching module.

The switching device may further comprise a processing module for monitoring the one or more predetermined conditions and for generating the condition trigger signal if the one or more predetermined conditions are fulfilled.

The switching device may further comprise an input sampling module for sampling one or more inputs to the switching device and wherein the one or more predetermined conditions are based on values of said one or more sampled inputs.

The switching signal may be a switch trigger signal based on a sensing of an input signal at an input port of the switching device.

The switching module may be configured for activation of an optical element in the switching module to switch the state of the switching element.

If a switching signal is generated to switch the switching element, the switching module may maintain the switched state of the switching element.

The switching device may further comprise an external actuator extending from an external surface of the housing of the switching device, the external actuator for translating the mechanical input to said actuator for receiving a mechanical input and for facilitating generation of an electrical toggle signal.

The external actuator may be a rocker-type actuator rotatable about the external surface.

The external actuator may be a lever rotatable about the external surface.

The external actuator may comprise a plunger member configured to contact the actuator for translating the mechanical input to the actuator, said contact based on rotation of the external actuator about the external surface.

The switching device may further comprise an external cover, the external cover configured to prevent the mechanical input to be applied to the actuator when the external cover is in a closed position with respect to the housing.

The external cover may further comprise a post.

The external cover may further comprise a latch for maintaining the external cover in the closed position.

The actuator may be configured to generate a signal level change between a high and a low voltage level upon receipt of a mechanical input.

The switching device may further comprise a status indicator for indicating the state of the switching element.

In accordance with another aspect, there is provided a method for switching states of a switching device. The method includes providing a switching module including a switching element, the switching module being configured to switch a state of the switching element upon generation of a switching signal; receiving a mechanical input at an actuator; generating an electrical toggle signal; and causing the switching module to switch a state of the switching element with the toggle signal.

The generation of the switching signal may be as a condition trigger signal based on one or more predetermined conditions.

The method may further comprise transmitting the toggle signal directly to the switching module.

The method may further comprise monitoring the one or more predetermined conditions and generating the condition trigger signal if the one or more predetermined conditions are fulfilled.

The method may further comprise sampling one or more inputs to the switching device and wherein the one or more predetermined conditions are based on values of said one or more sampled inputs.

The generation of the switching signal may be as a switch trigger signal based on sensing of an input signal at an input port of the switching device.

The method may further comprise activating an optical element in the switching module to switch the state of the switching element.

The method may further comprise monitoring an input signal at an input port and generating the switch trigger signal if a signal change is detected at the input port.

If a switching signal is generated to switch the switching element, the method may comprise maintaining the switched state of the switching element.

The method may further comprise providing an external actuator extending from an external surface of a housing of the switching device, the external actuator for translating the mechanical input to the actuator.

The external actuator may be a rocker-type actuator rotatable about the external surface.

The external actuator may be a lever rotatable about the external surface.

The external actuator may comprise a plunger member configured to contact the actuator for translating the mechanical input to the actuator based on rotating the external actuator about the external surface.

The method may further comprise providing an external cover, and preventing the mechanical input to be applied to the actuator when the external cover is in a closed position with respect to the housing.

The method may further comprise providing the external cover with a post.

The method may further comprise providing the external cover with a latch for maintaining the external cover in the closed position.

The method may further comprise after the step of receiving the mechanical input at the actuator, generating a signal level change between a high and a low voltage level.

The method may further comprise indicating the state of the switching element with a status indicator.

BRIEF DESCRIPTION OF THE DRAWINGS

Example embodiments of the disclosed technology will be better understood and readily apparent to one of ordinary skill in the art from the following written description, by way of example only, and in conjunction with the drawings, in which:

FIGS. 2(a)-2(d) show exploded views of an electronic relay during the steps of activating or deactivating a connectivity check on the electronic relay in various example embodiments.

FIGS. 10(b)-10(e) show exploded views of an electronic relay during the steps of activating or deactivating a connectivity check on the electronic relay in various example embodiments.

DETAILED DESCRIPTION

Example embodiments described herein may provide a switching device and a method for switching states of a switching device that may provide a connectivity check or test on a relay circuit/system and on a switching element of the switching device. This may also facilitate detecting whether the switching device is a malfunction product.

In the description herein, a switching device may be, but is not limited to, a relay (e.g. an electronic relay) that may be switched/powered on and off. An energization event of a relay may include, but is not limited to, an electrical powering on/off (or energization) of a switching element of the relay.

In the description below, a true trigger or switching signal based on a relay's one or more predetermined conditions/functions for switching the relay's state (e.g. for a timer relay, a level control relay, or a fault monitoring relay), may be referred to as a condition trigger signal while a simulated trigger signal in example embodiments for switching a relay's state (e.g. from using a trigger actuator to begin a connectivity test) may be referred to as a toggle trigger signal.

In some example embodiments, a condition trigger signal may be based on a detected fault. In other example embodiments, a condition trigger signal may be based on other predetermined conditions such as whether a predetermined period of time has elapsed for a time relay.

In yet other example embodiments, a true trigger or switching signal may be based on turn on or turn off (e.g. logic high or logic low) signals emitted by an external relay controller, such as a temperature controller, to switch the relay between, for example, a "switch to connect" state and a "switch to disconnect" state. In such example embodiments, the trigger signal may be referred to as a switch trigger signal while a simulated trigger signal in such example embodiments for switching a relay's state may be referred to as a toggle trigger signal.

Figure 1:
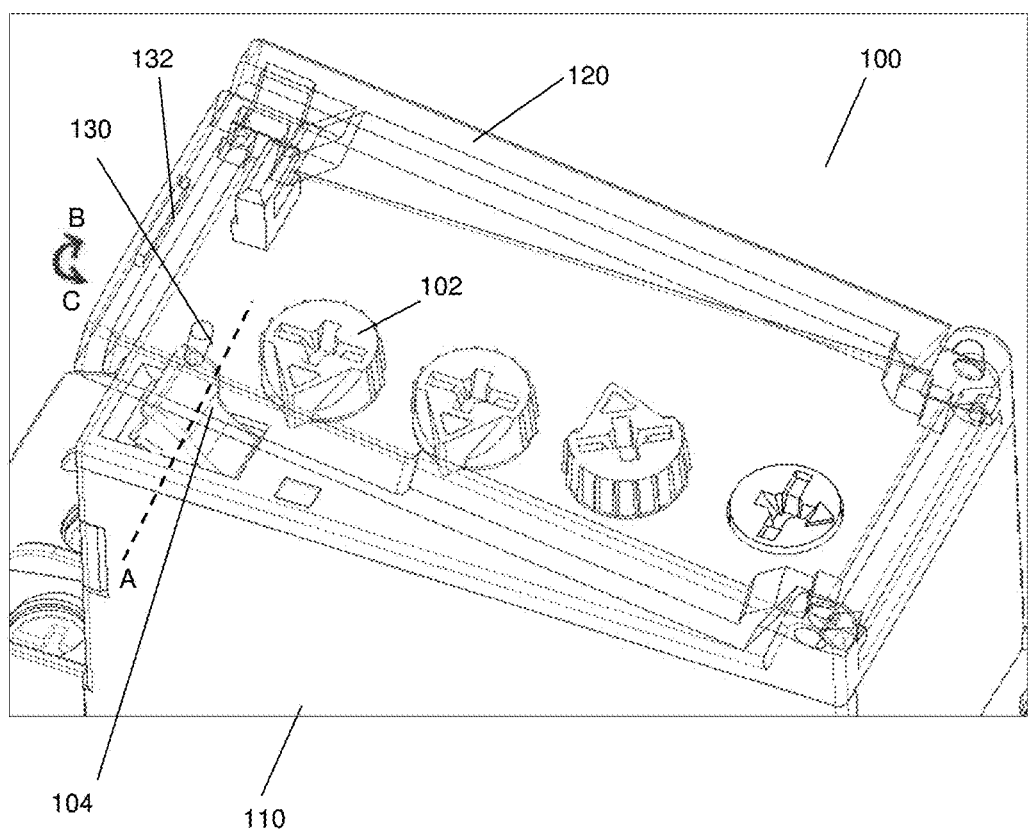
FIG. 1 shows a schematic perspective view of a relay frontage in an example embodiment.

FIG. 1 shows a schematic perspective view of a relay frontage in an example embodiment. In the example embodiment, the relay is an electronic relay. The electronic relay 100 comprises a housing 110, dials 102 mounted on an external surface of the housing 110 and a trigger actuator 104 extending from the external surface of the housing 110. The dials (e.g. 102) are used for setting predetermined conditions (e.g. threshold limits of parameters to be monitored such as for over-voltage, over-current etc.) For example, once a monitored parameter crosses or exceeds a set threshold, the electronic relay 100 switches states (e.g. between being energized or de-energized) for an electrical circuit connected to the electronic relay 100. The trigger actuator 104 is used to actuate a manual switching of the electronic relay 100. The trigger actuator 104 may be configured to be in a first position or a second position.

The trigger actuator 104 may be, but is not limited to, a lever. The lever is capable of being rotatable with respect to the external surface of the housing 110, or about axis A as shown. The first position may be an "up" position and the second position may be a "down" position, with respect to the external surface of the housing 110. In the example embodiment, the down position is also known as the normal position of the trigger actuator 104 when the actuator is not in a use mode. The trigger actuator 104 is in use when the trigger actuator 104 is in the "up" position.

Preferably, the electronic relay 100 further comprises a cover 120. The cover 120 may be attachably or detachably coupled to the housing 110 and covers the dials (e.g. 102) and the trigger actuator 104 when the cover 120 is in a closed position with respect to the electronic relay 100 (see arrow C). A user may open the cover 120 (see arrow B) to access the frontage such as to access dials (e.g. 102) and the trigger actuator 104. The cover 120 may be made of glass, a substantially transparent plastic material or any other suitable material that is substantially transparent. In alternative embodiments, the cover 120 may even be opaque or substantially opaque to light. The cover 120 comprises a post or pin 130 being located in a corresponding position to the trigger actuator 104 such that when the cover 120 is in a closed position, the pin 130 is in mechanical contact with the trigger actuator 104 to cause or bias the trigger actuator 104 to be in a down position. The cover 120 may further comprise a latch catch 132 for locking or retaining the cover 120 to the surface of the housing 110 when the cover 120 is in a closed position.

In another example embodiment, the post or pin 130 is located on the trigger actuator 104 such that when the cover 120 is in a closed position, the pin 130 comes into mechanical contact with the cover 120 to cause or bias the trigger actuator 104 to be in a down position.

In yet another example embodiment, the actuator may be, but is not limited to, a depressable button. In this example embodiment, the press button may be configured to be in a first position or a second position. The first position may be an "up" position and the second position may be a "down" position with respect to an external surface of the housing. In this case, the up position is also known as the normal position of the press button when the press button is not in a use mode (i.e. not depressed).

In yet another example embodiment, the actuator may be, but is not limited to, a rocker-type actuator. In this example embodiment, the rocker-type actuator may be configured to be in a first position or a second position. The first position may be an "up" position in relation to a trailing end of the rocker-type actuator, and the second position may be a "down" position in relation to a trailing end of the rocker-type actuator, the first and second positions being with respect to the external surface of the housing. In the example embodiment, the down position is also known as the normal position of the rocker-type actuator when the actuator is not in a use mode. The rocker-type actuator is in use when the rocker-type actuator is in the "up" position.

Preferably, the relay frontage may comprise a status indicator (not shown) to indicate a switch state of the relay.

Figure 13:
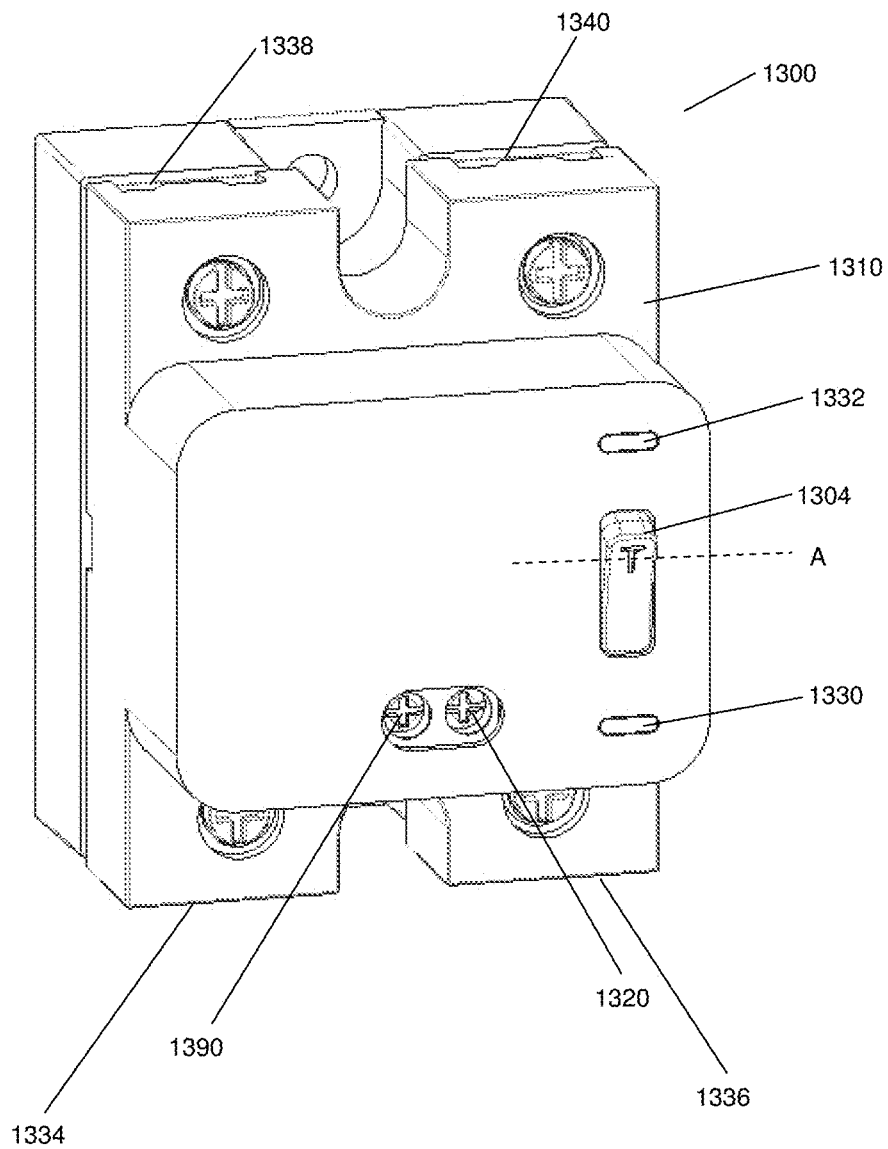
FIG. 13 shows a schematic perspective view of a solid state relay in an example embodiment.

FIG. 13 shows a schematic perspective view of a relay in an example embodiment. In the example embodiment, the relay is a solid state relay. The solid state relay 1300 comprises a housing 1310, a power connector 1320 provided on an external surface of the housing 1310, a switch actuator 1304 extending from the external surface of the housing 1310, a first status indicator 1330 provided on the external surface of the housing 1310, and a second status indicator 1332 provided on the external surface of the housing 1310. The solid state relay 1300 further comprises a diagnosis output connector 1390 provided on an external surface of the housing 1310. The input ports are located at numerals 1334 and 1336 and the output ports are located at numerals 1338 and 1340.

In the example embodiment, the switch actuator 1304 is used to actuate a manual switching of the solid state relay 1300. The switch actuator 1304 may be configured to be in a first position or a second position.

The power connector 1320 is used to connect the solid state relay 1300 to an auxiliary power supply for operation of the switch actuator 1304. The first status indicator 1330 is used to indicate whether the solid state relay 1300 is in a "switch to connect" or a "switch to disconnect" state. For example, when the solid state relay 1300 is in a "switch to connect" state, the first status indicator 1330 is in a first mode. When the solid state relay 1300 switches to a "switch to disconnect" state, the first status indicator 1330 changes to a second mode. The first mode may be an "on" state and the second mode may be an "off" state of the solid state relay. Thus, for example, the first status indicator 1330 may be in an "on" state if an input signal is provided at input ports 1334 and 1336 and/or the switch actuator 1304 has been activated to simulate an input for switching states.

In the example embodiment, the first status indicator may be, but is not limited to, a light emitting diode indicator. For example, when the solid state relay 1300 is in a "switch to connect" state, the light emitting diode indicator is in an "ON" or lit state. When the solid state relay 1300 switches to a "switch to disconnect" state, the light emitting diode indicator changes to an "OFF" or unlit state, or vice versa.

In the example embodiment, the second status indicator 1332 is used to indicate the condition or diagnostics of the solid state relay. The conditions include, but are not limited to, whether the solid state relay is operating normally, whether the solid state relay is internally short-circuited at the input, whether the solid state relay is externally short-circuited at the output, whether the output supply of the solid state relay is removed, or whether the output load of the solid state relay is removed/cut. For example, when the solid state relay 1300 is operating normally, the second status indicator 1332 is in a third mode. When the solid state relay 1300 is internally short-circuited at the input, the second status indicator 1332 changes to a fourth mode. When the solid state relay 1300 is externally short-circuited at the output, the second status indicator 1332 changes to a fifth mode. When the output supply of the solid state relay is removed, the second status indicator 1332 changes to a sixth mode. When the output load of the solid state relay is removed/cut, the second status indicator 1332 changes to a seventh mode.

In the example embodiment, the second status indicator may be, but is not limited to, a light emitting diode indicator. For example, when the solid state relay 1300 is operating normally, the second status indicator 1332 is in a third mode. The third mode comprises the second status indicator 1332 showing an orange light or is in an "OFF" or unlit state. When the solid state relay 1300 is internally short-circuited at the input, the second status indicator 1332 is in a fourth mode. The fourth mode comprises the second status indicator 1332 showing a red light. When the solid state relay 1300 is externally short-circuited at the output, the second status indicator 1332 is in a fifth mode. The fifth mode comprises the second status indicator 1332 showing a red light flashing at a relatively fast speed (e.g. 5% ON and 95% OFF in a given time period). When the output supply of the solid state relay is removed, the second status indicator 1332 is in a sixth mode. The sixth mode comprises the second status indicator 1332 showing a red light flashing at a relatively slow speed (e.g. 80% ON and 20% OFF in a given time period). When the output load of the solid state relay is removed/cut, the second status indicator 1332 is in a seventh mode. The seventh mode comprises the second status indicator 1332 showing shows a red light flashing at a relatively slow speed (e.g. 80% ON and 20% OFF in a given time period). Reference is also exemplarily made to Table 1A in the description.

It will be appreciated that the sensing of the condition or diagnostics may indicate electrical performance of the relay 1300 while the switch actuator 1304 advantageously allows a user to test switching a state of the relay 1300 (e.g., to affect an output load connected at the output ports 1338 and 1340).

The diagnosis output connector 1390 is used to connect the solid state relay 1300 to a system for raising an alarm signal. For example, the alarm signal is an audio signal or a visual signal or both. The alarm signal may be based on the condition or diagnostics indicated with the second status indicator 1332.

The switch actuator 1304 may be, but is not limited to, a lever. The lever is capable of being rotatable with respect to the external surface of the housing 1310, or about axis A as shown. The first position may be an "up" position and the second position may be a "down" position, with respect to the external surface of the housing 1310. In the example embodiment, the down position is also known as the normal position of the switch actuator 1304 when the switch actuator is not in a use mode. The switch actuator 1304 is in use when the switch actuator 1304 is in the "up" position.

In yet another example embodiment, the switch actuator may be, but is not limited to, a depressable button. In this example embodiment, the press button may be configured to be in a first position or a second position. The first position may be an "up" position and the second position may be a "down" position with respect to an external surface of the housing. In this case, the up position is also known as the normal position of the press button when the press button is not in a use mode (i.e. not depressed).

In yet another example embodiment, the switch actuator may be, but is not limited to, a rocker-type actuator. In this example embodiment, the rocker-type actuator may be configured to be in a first position or a second position. The first position may be an "up" position in relation to a trailing end of the rocker-type actuator, and the second position may be a "down" position in relation to a trailing end of the rocker-type actuator, the first and second positions being with respect to the external surface of the housing. In the example embodiment, the down position is also known as the normal position of the rocker-type actuator when the switch actuator is not in a use mode. The rocker-type actuator is in use when the rocker-type actuator is in the "up" position.

The solid state relay 1300 may preferably be provided with a cover configuration substantially similar to the cover 120 with pin 130 as described with respect to FIG. 1. The cover may be attachably or detachably coupled to the housing 1310 and covers the switch actuator 1304 when the cover is in a closed position with respect to the solid state relay 1300. A user may open the cover to access the frontage such as to access, for example, the switch actuator 1304. The cover may be made of glass, a substantially transparent plastic material, or any other suitable material that is substantially transparent. In alternative embodiments, the cover may even be opaque or substantially opaque to light. The cover comprises a post or pin being located in a corresponding position to the switch actuator 1304 such that when the cover is in a closed position, the pin is in mechanical contact with the switch actuator 1304 to cause or bias the switch actuator 1304 to be in a down position. The cover may further comprise a latch catch for locking or retaining the cover to the surface of the housing 1310 when the cover is in a closed position.

In another example embodiment, the post or pin is located on the switch actuator 1304 such that when the cover is in a closed position, the pin comes into mechanical contact with the cover to cause or bias the switch actuator 1304 to be in a down position.

FIGS. 2(*a*) and 2(*b*) show exploded views of a relay during the steps of activating or deactivating a trigger/switch check or connectivity test on the relay in various example embodiments. The relay may be an electronic relay (as described with reference to FIG. 1), a solid state relay (as described with reference to FIG. 13), or any other type of relay.

Figure 2B:
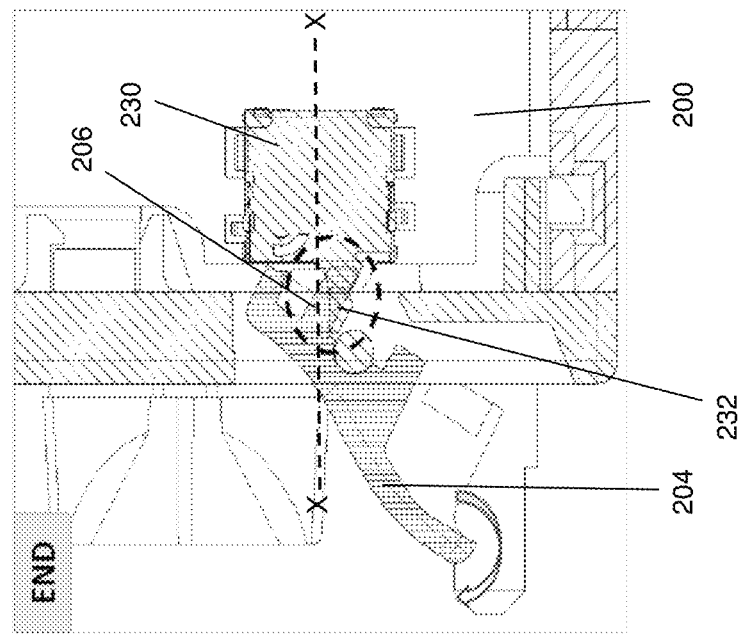
Figure 2A:
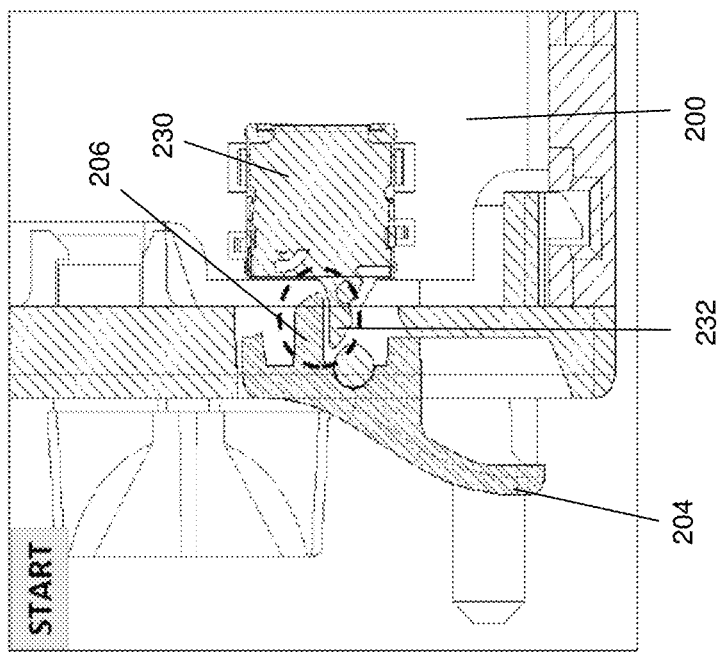

FIG. 2(a) shows an example exploded view of a relay 200 when a trigger/switch actuator 204 is in a normal or down position. The trigger/switch actuator 204 comprises a plunger member 206 which extends into an interior of the relay 200. The relay 200 further comprises a detent switch 230 disposed in the interior of the relay 200. The trigger/switch actuator 204 is configured to activate or deactivate the detent switch 230 in an opening or closing operation. When the trigger/switch actuator 204 is in a normal or down position, the plunger member 206 is located in a position such as, for example, spaced apart from (or minimally contacting) an activator member 232 of the detent switch 230 such that the activator member 232 is not mechanically biased to be activated. In this example embodiment, in the normal or down position, the plunger member 206 is not in contact with the activator member 232.

FIG. 2(b) shows an example exploded view of the relay 200 when the trigger/switch actuator 204 is in an up position. In this example embodiment, the trigger/switch actuator 204 is a lever rotatable about an axis vertically into the drawing page (compare with axis A of FIG. 1). When power is provided to the relay 200 (e.g., either by a power supply Vcc to the relay 200 or via auxiliary power supplied using a power connector), and if a user begins to rotate the trigger/switch actuator 204 from the normal or down position to an up position, the trigger/switch actuator 204 moves into mechanical contact with the activator member 232 to bias against the activator member 232. A debugging trigger/switch check process or connectivity test begins. For example, when the trigger/switch actuator 204 is rotated into the up position and the plunger member 206 reaches a predetermined angle (e.g. about 30 degrees with respect to the axis x-x), the activator member 232 is activated to trigger a connectivity test on the circuit/system that the relay 200 is connected to. The activator member 232 maintains the plunger member 206 in biased contact and the trigger/switch actuator 204 is maintained at the up position.

For example, for an electronic relay, the connectivity test simulates a trigger signal to a switching element of the relay 200 to determine whether the circuit/system is capable of reacting to the relay 200 switching states if one or more thresholds (compare dials 102) are exceeded.

In another example, for a solid state relay, the connectivity test simulates a switching signal to, for example, optically couple a switching module to determine whether the circuit/system (connected at an output of the relay) is capable of reacting to the solid state relay switching states if a switching signal is received from an external relay controller at an input of the solid state relay.

During this connectivity test mode, the user is able to leave the relay 200 to work on other operations. For example, a snap device may be provided on the trigger/switch actuator 204 to hold the position of the trigger/switch actuator 204, whether at the up or down position. The connectivity test mode may be ended when the user moves the trigger/switch actuator 204 from the up position to the down or normal position.

Therefore, in the example embodiment, the detent switch 230 functions as an actuator for receiving a mechanical input and for facilitating generation of an electrical toggle signal while the trigger/switch actuator 204 functions as an external actuator for use by a user to provide a mechanical input and for translating the mechanical input to the actuator.

FIGS. 2(c) and 2(d) illustrate an example embodiment with an optional cover 220 added to the relay 200.

FIG. 2(c) shows an exploded view of the relay 200 when the trigger/switch actuator 204 is in an up position and the cover 220 is in an open position with respect to the relay 200 in the example embodiment. When a connectivity test is being conducted, the trigger/switch actuator 204 is in an up position, as illustrated with reference to FIG. 2(b). A post or pin 230 of the cover 220, may be, for example, spaced apart from (or minimally contacting) a portion of the trigger/switch actuator 204 such as a trailing member 208 of the trigger/switch actuator 204. Thus, the connectivity test may proceed without interruption.

As a compressive force is applied to the cover 220 to move the cover 220 to a closed position with respect to the relay 200, a corresponding force is applied by the pin 230 onto the trigger/switch actuator 204 (e.g. via the trailing member 208). The force causes the trigger/switch actuator 204 to move/rotate from the up position towards the normal or down position. As the plunger member 206 begins to lose contact with the activator member 232 or as the biasing force is removed from the activator member 232, the connectivity test is disabled and ends. Therefore, the connectivity test ends when the cover 220 is moved to the closed position.

FIG. 2(d) shows an exploded view of the relay 200 when the trigger/switch actuator 204 is in a normal or down position and the cover 220 is in a closed position. When the cover 220 is in a closed position and for example, further, a catch/latch on the cover 220 retains the cover 220 onto the surface of the relay 200, the pin 230 mechanically contacts the trigger/switch actuator 204 to prevent the trigger/switch actuator 204 from being rotated from a normal or down position into an up position. Therefore, in the example embodiment, maintaining the cover 220 in a closed position on the relay 200 may prevent a connectivity test from being carried out by switching the relay 200 accidentally. This may be advantageous if the relay 200 is actively connected to an electrical circuit (e.g. for control purposes) and therefore, the relay 200 may be prevented from being accidentally switched between states to affect the electrical circuit.

Figure 10A:
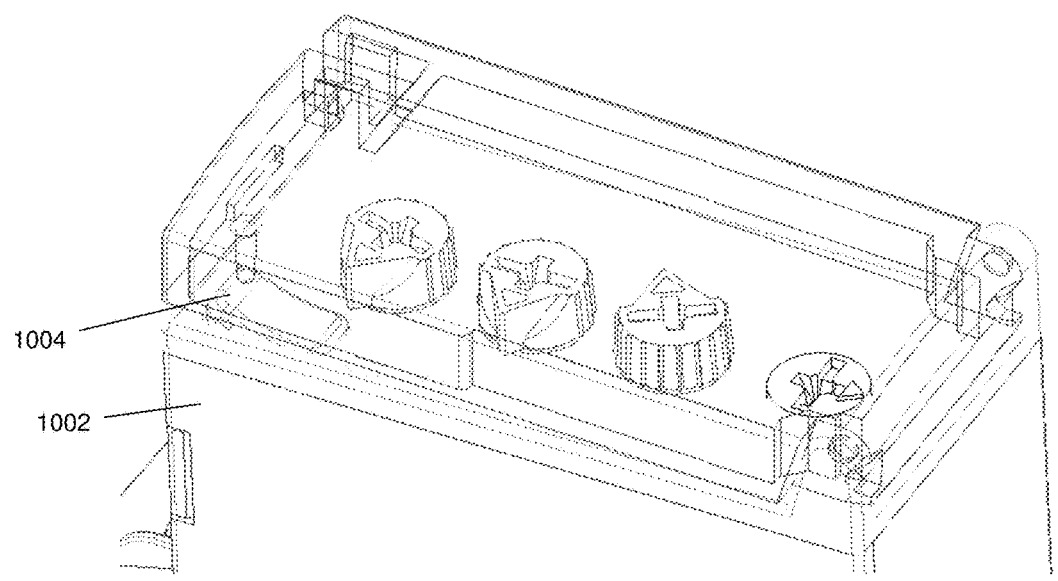
FIG. 10(a) shows a schematic view of a relay frontage in an example embodiment having a rocker-type actuator as a trigger actuator.

FIG. 10(a) shows a schematic view of a relay frontage in an example embodiment having a rocker-type actuator as a trigger actuator. In other example embodiments, the rocker-type actuator may be a switch actuator. In the example embodiment, the relay is an electronic relay 1002. In other example embodiments, the relay may be other types of relays, such as a solid state relay etc. The rocker-type actuator 1004 is described in more detail in FIGS. 10(b) to 10(e).

Figure 10C:
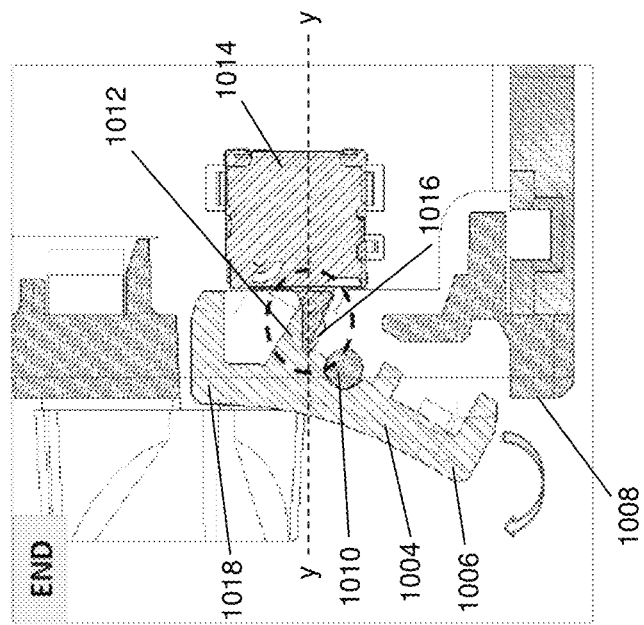
Figure 10B:
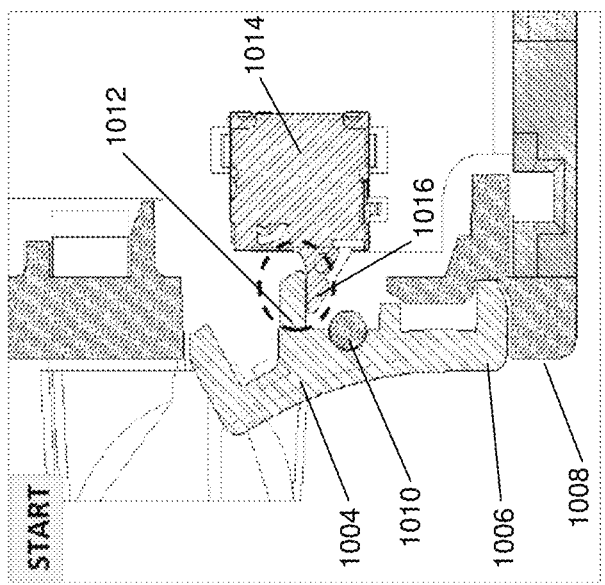

FIG. 10(b) is an exploded view of the relay 1002 when the rocker-type actuator 1004 is in a normal or down position in the example embodiment. The down position is the position of a trailing end 1006 of the rocker-type actuator 1004 with respect to an external surface 1008 of the relay 1002. The rocker-type actuator 1004 is rotatable about the external surface 1008, about a pivot 1010 such as a shaft/cylinder 1010. Thus, in this example embodiment, the rocker-type actuator 1004 is rotatable about an axis vertically into the drawing page (compare with axis A of FIG. 1).

The rocker-type actuator 1004 comprises a plunger member 1012 which extends into an interior of the relay 1002. The relay 1002 further comprises a detent switch 1014 disposed in the interior of the relay 1002. The rocker-type actuator 1004 is configured to activate or deactivate the detent switch 1014 in an opening or closing operation. When the rocker-type actuator 1004 is in a normal or down position, i.e. the trailing end 1006 is in a down position with respect to the external surface 1008, the plunger member 1012 is located in a position such as, for example, spaced apart from (or minimally contacting) an activator member 1016 of the detent switch 1014 such that the activator member 1016 is not mechanically biased to be activated. In this example embodiment, in the normal or down position, the plunger member 1012 is in minimal contact with the activator member 1016.

FIG. 10(c) shows an exploded view of the relay 1002 when the rocker-type actuator 1004 is in an up position in the example embodiment. That is, the trailing end 1006 of the rocker-type actuator 1004 is in an up position with respect to the external surface 1008 of the relay 1002. In the example embodiment, a user may apply a force to a leading end 1018 of the rocker-type actuator 1004 to rotate the rocker-type actuator 1004 about the pivot 1010.

When power is provided to the relay 1002 (e.g., either by a power supply Vcc to the relay 1002 or via auxiliary power supplied using a power connector), and if a user begins to apply a force to the leading end 1018 of the rocker-type actuator 1004, the plunger member 1012 mechanically contacts the activator member 1016 to bias against the activator member 1016. A debugging trigger/switch check process or connectivity test begins. For example, when the trailing end 1006 of the rocker-type actuator 1004 is rotated into the up position and the plunger member 1012 reaches a predetermined angle (e.g. about 30 degrees with respect to the axis y-y), the activator member 1016 is activated to trigger a connectivity test on the circuit/system that the relay 1002 is connected to. Thus, the plunger member 1012 is configured to contact the activator member 1016 of the detent switch 1014 for translating the mechanical input or force by a user to the detent switch 1014 whereby the contact between the plunger member 1012 and the detent switch 1014 is based on rotation of the rocker-type actuator 1004 about the external surface 1008.

The activator member 1016 is maintained in biased contact and the trailing end 1006 of the rocker-type actuator 1004 is maintained at the up position, until the user applies a force at the trailing end 1006 to rotate the trailing end 1006 of the rocker-type actuator 1004 to the down position.

In the example embodiment, the connectivity test simulates (with a toggle signal) a trigger signal to a switching element of the relay 1012 to determine whether the circuit/system is capable of reacting to the relay 1012 switching states if one or more thresholds (e.g. compare dials 102) are exceeded.

In other example embodiments, for a solid state relay, the connectivity test simulates (with a toggle signal) a switch signal to, for example, optically couple a switching module to determine whether the circuit/system (connected at an output of the relay) is capable of reacting to the solid state relay switching states (e.g. as if a switching signal is received from an external relay controller at an input of the solid state relay).

During this connectivity test mode, the user is able to leave the relay 1002 to work on other operations. The connectivity test mode may be ended when the user applies a force at the trailing end 1006 to rotate the trailing end 1006 of the rocker-type actuator 1004 from the up position to the down position or normal position.

FIGS. 10(d) and 10(e) illustrate an example embodiment with an optional cover 1020 added to the relay 1002.

FIG. 10(d) shows an exploded view of the relay 1002 when the rocker-type actuator 1004 is in an up position and the cover 1020 is in an open position with respect to the relay 1002 in the example embodiment. When a connectivity test is being conducted, the rocker-type actuator 1004 is in an up position, as illustrated with reference to FIG. 10(c). A post or pin 1022 of the cover 1020 may be, for example, spaced apart from (or minimally contacting) the trailing end 1006 of the rocker-type actuator 1004. Thus, the connectivity test may proceed without interruption.

As a compressive force is applied to the cover 1020 to move the cover 1020 to a closed position with respect to the relay 1002, a corresponding force is applied by the pin 1022 onto the rocker-type actuator 1004 (e.g. via the trailing end 1006). The force causes the rocker-type actuator 1004 to move/rotate from the up position towards the normal or down position. As the plunger member 1012 begins to lose contact with the activator member 1016 or as the biasing force is removed from the activator member 1016, the connectivity test is disabled and ends. Therefore, the connectivity test ends when the cover 1020 is moved to the closed position.

FIG. 10(e) shows an exploded view of the relay 1002 when the rocker-type actuator 1004 is in a normal or down position and the cover 1020 is in a closed position. The cover 1020 may be in contact with at least a portion of the external surface 1008 of the relay 1002.

When the cover 1020 is in a closed position and for example, further, a catch/latch on the cover 1020 retains the cover 1020 onto the surface of the relay 1002, the pin 1022 is positioned to prevent the trailing end 1006 of the rocker-type actuator 1004 from being rotated from a normal or down position into an up position. Therefore, in the example embodiment, maintaining the cover 1020 in a closed position on the relay 1002 may prevent a connectivity test from being carried out by switching the relay 1002 accidentally. This may be advantageous if the relay 1002 is actively connected to an electrical circuit (e.g. for control purposes) and therefore, the relay 1002 may be prevented from being accidentally switched between states to affect the electrical circuit.

Figure 3:
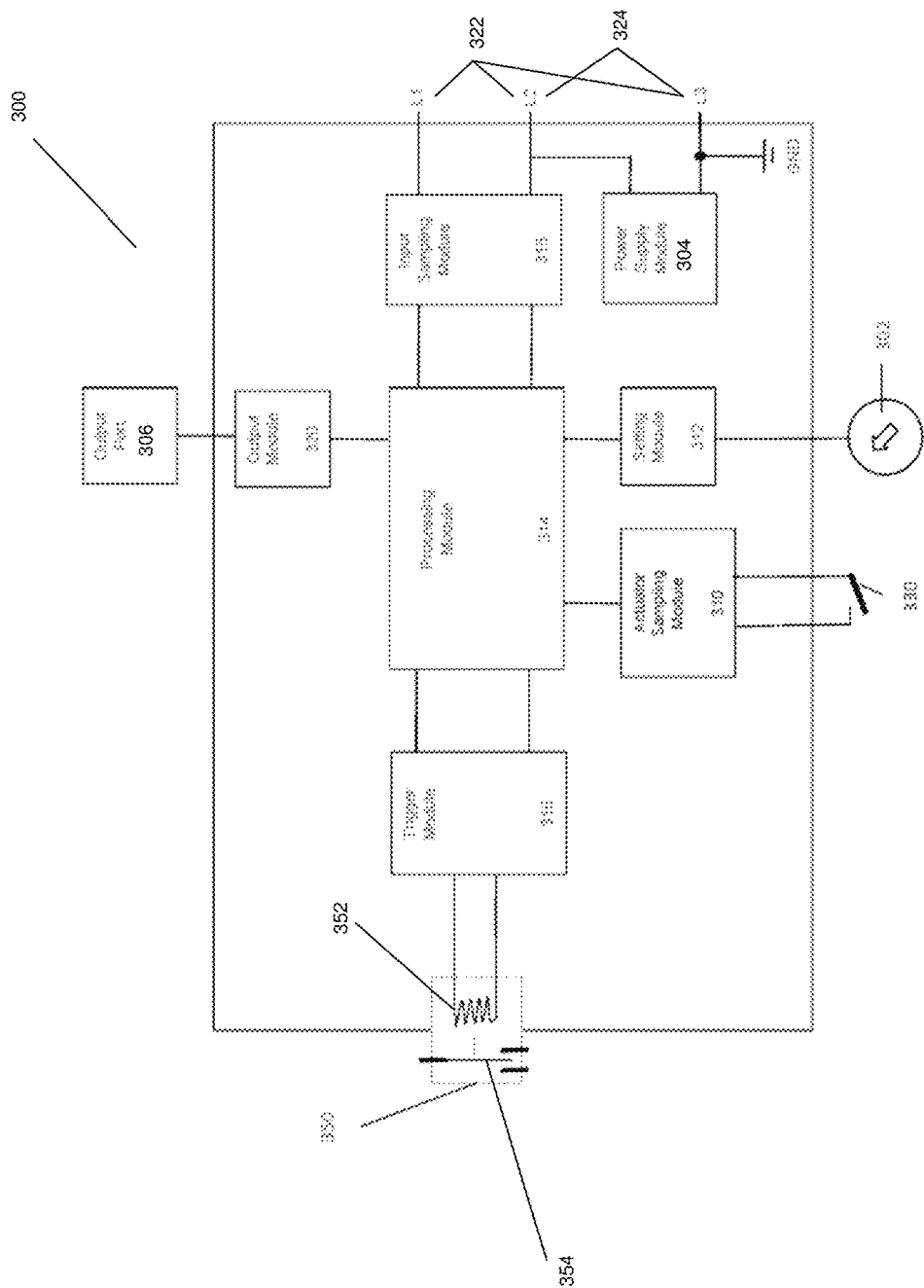
FIG. 3 shows a schematic diagram for illustrating an electronic relay in an example embodiment.

FIG. 3 shows a schematic diagram for illustrating an electronic relay in an example embodiment. The relay 300 functions substantially similarly to the relays 100, 200 described with reference to FIG. 1 and FIGS. 2(a) to 2(d) respectively. The relay 300 comprises a processing module 314, an input sampling module 318 coupled to the processing module 314, an actuator sampling module 310 in electrical connection to a detent switch 330 and coupled to the processing module 314, a trigger module 316 coupled to the processing module 314 and a switching element/member 350 coupled to the trigger module 316. In the example embodiment, the processing module 314 may be implemented using an integrated circuit chip such as STM32F100C from STMicroelectronics or LPC1114 from NXP etc. The relay 300 further comprises a power supply module 304 coupled to the input sampling module 318, a setting module 312 in connection to a dial 302, an output module 320 coupled to the processing module 314 and an output port 306 coupled to the output module 320. The power supply module 304 also provides power to various components of the relay 300 (e.g. the processing module 314).

In the example embodiment, the input sampling module 318 is used for sensing one or more inputs 322 and 324 for detection of a value of a parameter such as voltage, current etc. A user may use the dial 302 to control a predetermined threshold limit in the setting module 312 for the relay 300. The processing module 314 processes the value of the parameter from the input sampling module 318 to determine whether a predetermined threshold limit transmitted from the setting module 312 is exceeded. If it is determined that the predetermined threshold limit is exceeded, the processing module 314 flags a fault condition/status and activates the trigger module 316 with a switching signal. For example, the trigger module 316 may energize or de-energize a coil element 352 of the switching element/member 350 to cause a switch 354 to switch states (for example between normally open (NO) and normally closed (NC) states). Thus, the switching member 350 is capable of switching between an energized and a de-energized state. The state of the switching member 350 is configured to being the state of the relay 300. In the example embodiment, the trigger module 316 and the switching element 350 may be known collectively as a switching module. The output module 320 functions to process, for example, a value of the parameter and transmits the value to be communicated externally at the output port 306.

Figure 11A:
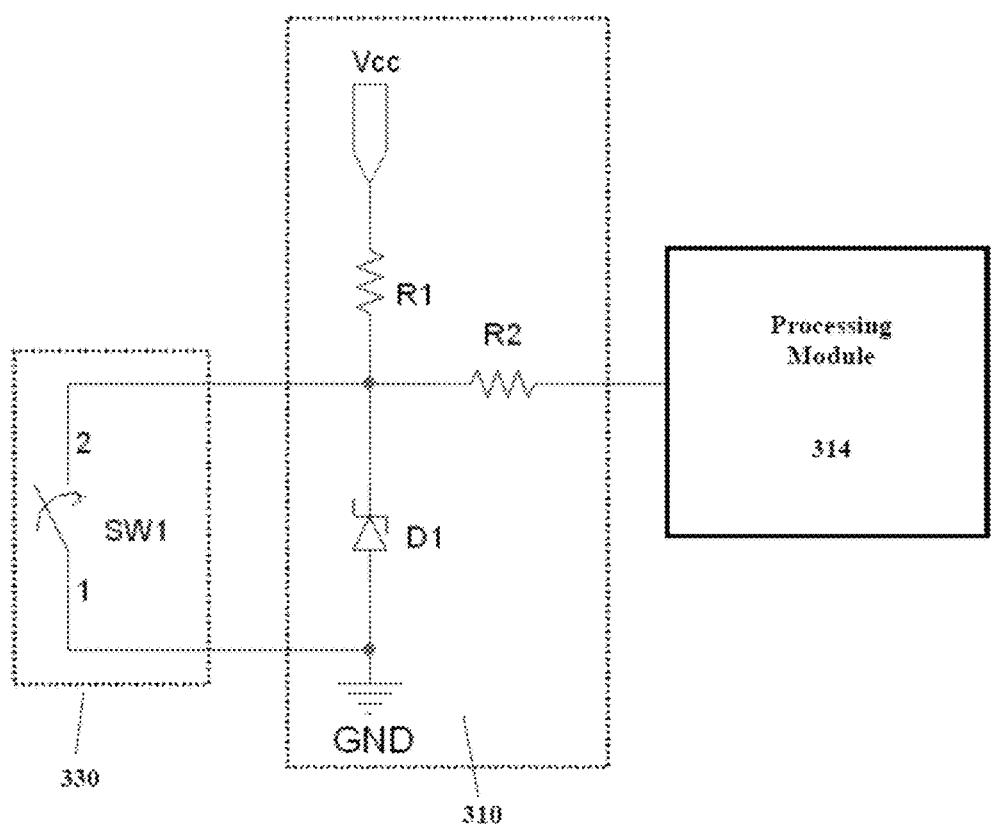
FIGS. 11(a)-11(b) are schematic circuit diagrams illustrating an example implementation of a detent switch for facilitating generation of an electrical toggle signal to a switching module for a relay in an example embodiment.
Figure 11B:
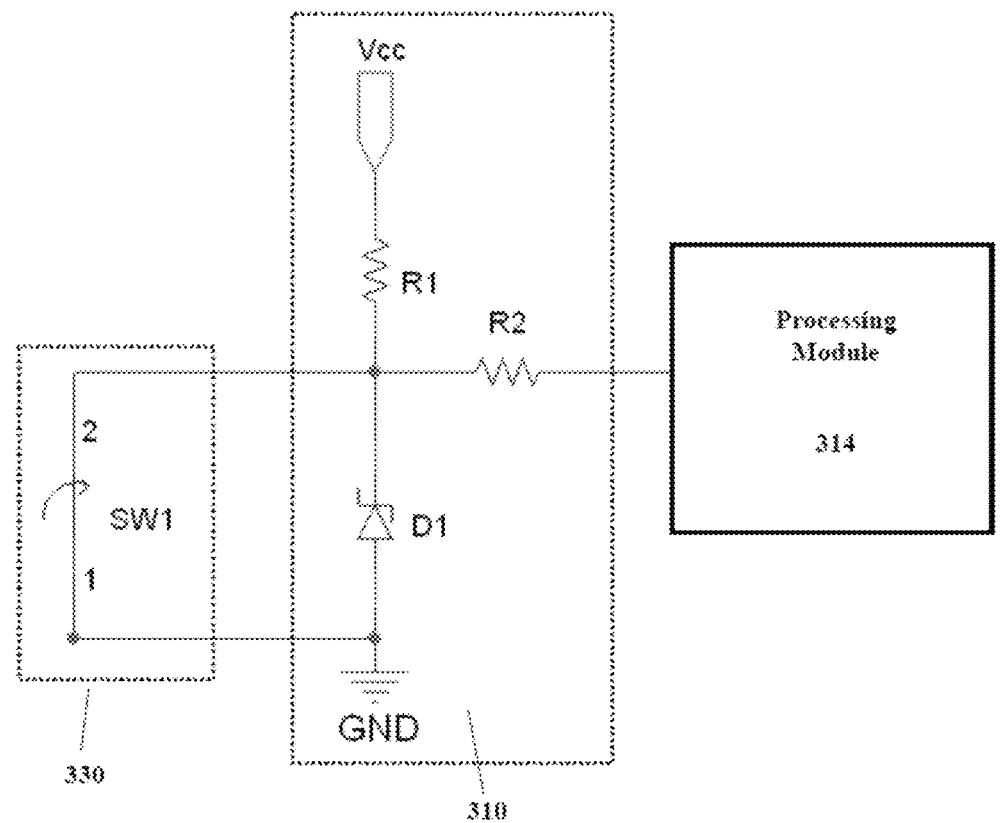

In the example embodiment, the actuator sampling module 310 is used for manually instructing the processing module 314 to activate the trigger module (with a toggle trigger signal). The processing module 314 differentiates the trigger commands from one or more predetermined conditions being met (e.g., a threshold limit being exceeded), and from the actuator sampling module 310 by a flagged status (e.g., a fault status flag or a connectivity test status flag). If the command or trigger signal is from the actuator sampling module 310, a connectivity test status is flagged or a fault status is flagged. In the example embodiment, the detent switch 330 is configured to be connected to a power source such that a switch in the detent switch 330 may send a change in a signal level to the processing module 314 (e.g., from Vcc to ground or from ground to Vcc) to signal the processing module 314 to control the trigger module 316 to switch the state of the switching member 350. An example implementation is with reference to FIGS. 11(a) and 11(b).

Figure 12A:
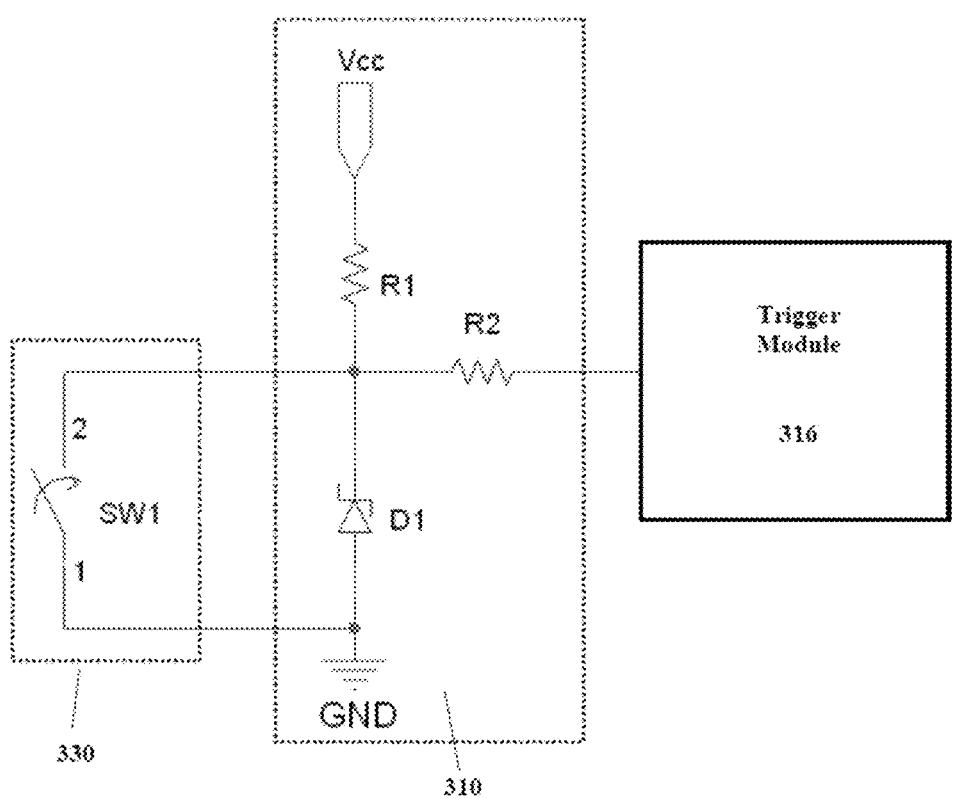
FIGS. 12(a)-12(b) are schematic circuit diagrams illustrating another example implementation of a detent switch for facilitating generation of an electrical toggle signal to a switching module for a relay in an example embodiment.
Figure 12B:
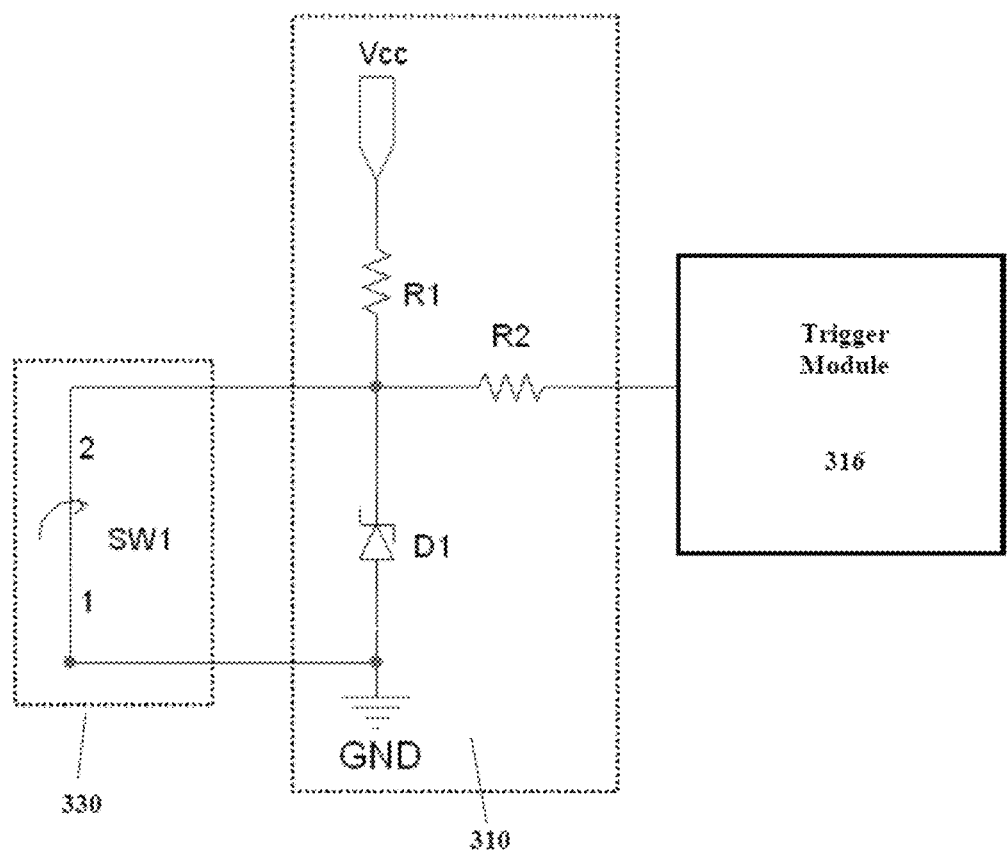

It will be appreciated that, in alternative example embodiments, the actuator sampling module 310 may be modified to be connected directly to the trigger module 316. The trigger module 316 may be modified to differentiate the trigger commands from one or more predetermined conditions being met (e.g., a threshold limit being exceeded), and from the actuator sampling module 310 by flag status (e.g. a fault status flag or a connectivity test status flag). An example implementation is with reference to FIGS. 12(a) and 12(b).

The switching member 350 may be an electromechanical relay. The switching member 350 may be a solid-state relay such as, but not limited to, a transistor, a TRIAC, or a tyristor.

When a trigger actuator (e.g. trigger actuator 104 or trigger actuator 204) is in a normal or down position, a circuit connecting the detent switch 330 to the trigger actuator sampling module 310 is open. When the trigger actuator (e.g. trigger actuator 104 or trigger actuator 204) is in an up position, the circuit connecting the detent switch 330 to the actuator sampling module 310 is closed.

In a normal operation of an electronic relay, the relay switches state (e.g. from an energized state to a de-energized state) when an input reaches or exceeds a predetermined threshold limit of an operating level. For example, an electronic relay may switch to cut power to an electrical circuit if an overvoltage condition is sensed by the relay.

In the example embodiment, during a normal (or non-fault) operation, when the relay 300 is powered on, the input sampling module 318 samples the inputs 322 and 324. The relay 300 may be monitoring the inputs 322 and 324 and may send a first signal to the processing module 314. The processing module 314 processes the first signal to determine whether a predetermined threshold limit (transmitted from the setting module 312) is exceeded. That is, the processing module 314 detects whether there is a fault condition. The processing module 314 sends a second signal to the output module 320 to transmit a value of the inputs 322 and 324. In the example embodiment, the switching member 350 is in an energized state.

If a fault condition is detected, the processing module 314 instructs the trigger module 316 with a switching signal to switch the switching member 350 to a de-energized state and a fault status is flagged.

During a normal (or non-fault) operation, if the trigger actuator (e.g. trigger actuator 104 or trigger actuator 204) is moved to an up position, the circuit connecting the detent switch 330 to the actuator sampling module 310 becomes closed. That is, the detent switch 330 receives a mechanical input and begins to facilitate generation of an electrical toggle trigger signal, at the processing module 314 in the example embodiment, to the switching module. The toggle signal is for instructing the switching module to switch a state of the switching member/element 350.

A connectivity check on a circuit/system, in which the relay 300 is part of, begins. The actuator sampling module 310 is activated (or toggles from Vcc to ground; or from ground to Vcc) and sends a toggle signal to the processing module 314. The processing module 314 flags a connectivity test/check status and sends a fourth signal to activate the trigger module 316 to switch the switching member 350. If the connectivity is working normally, the switching member 350 switches states (e.g. from an energized state to a de-energized state) and the circuit/system that the relay 300 is part of reacts as it is arranged to do so. The relay 300 switches to a de-energized state and follow-up actions are taken (e.g. an alarm may be raised). Therefore, a user also knows that the relay 300 is working properly and there is no connectivity fault in the circuit/system that the relay 300 is part of.

Otherwise, if the switching member 350 maintains its state, the user may conclude that there is a switching error with the relay 300. The user may also conclude that there is a connectivity error with the circuit/system if the relay 300 switches but the follow-up actions are not taken.

Advantageously, to determine connectivity, the user need not send an over-threshold input signal at the input sampling module 318 as this may be dangerous.

In the example embodiment, if the processing module 314 has flagged a connectivity check status, moving the trigger actuator (e.g. trigger actuator 104 or trigger actuator 204) to a down or normal position causes the processing module 314 to confirm that a fault status flag is not present and to switch the state of the switching member 350 (e.g. back to an energized state) and the connectivity test status flag is removed at the processing module 314.

If there is a fault in an input such as, for example, if the processing module 314 has flagged a fault status instead of (or in addition to) a connectivity check status, the relay 300 and the switching member 350 cannot be switched to, for example, an energized state using the trigger actuator. In this case, even when the trigger actuator is moved to an up position, the relay 300 and the switching member 350 do not switch states (e.g., the switching member 350 and the relay 300 remain in a de-energized state). The different flag statuses work as a safety feature so that the switching member 350 is prevented from switching (e.g. from a de-energized state to an energized state) and therefore, is not affected by the position of the trigger actuator, for example, by a user erroneously trying to switch the relay 300 when there is an actual fault in an input.

In the example embodiment, when no power is supplied to the relay 300 by the power supply module 304, the switching member 350 may not change states from an energized state to a de-energized state, regardless of the position of the trigger actuator.

Figure 14:
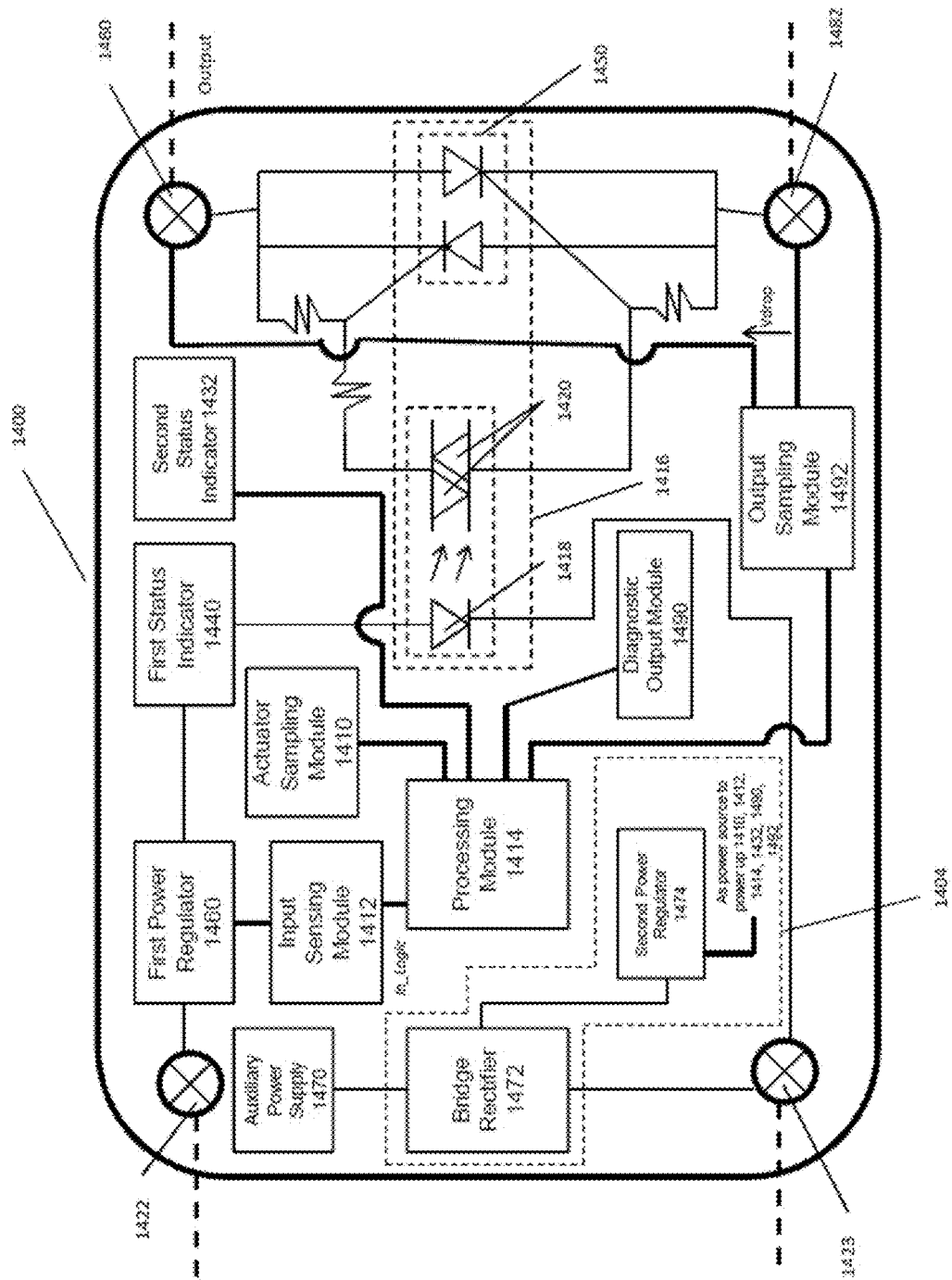
FIG. 14 shows a schematic diagram for illustrating a solid state relay in an example embodiment.

FIG. 14 shows a schematic diagram for illustrating a solid state relay in an example embodiment. The relay 1400 functions substantially similarly to the relays 1300, 200 described with reference to FIGS. 13 and 2(*a*)-2(*d*) respectively. The relay 1400 comprises input ports 1422 and 1423, a first power regulator 1460 coupled to an input port 1422, an input sensing module 1412 coupled to the first power regulator 1460, a processing module 1414 coupled to the input sensing module 1412, an actuator sampling module 1410 coupled to the processing module 1414, a first status indicator 1440 coupled to the first power regulator 1460, a switching module 1416 coupled to the first status indicator 1440, a second status indicator 1432 coupled to the processing module 1414, a diagnosis output module 1490 coupled to the processing module 1414, and an output sampling module 1492 coupled to the processing module 1414. The switching module 1416 comprises a switching member/element 1450 coupled to the switching module 1416. The actuator sampling module 1410 is in electrical connection to a detent switch of a switch actuator (e.g. switch actuator 1304). In the example embodiment, the processing module 1414 is also configured to detect whether an input signal is connected at input ports 1422 and 1423.

The relay 1400 further comprises a power supply module 1404 connected to a power connector (not shown) that may be provided with an auxiliary power supply 1470. The power supply module 1404 comprises a bridge rectifier 1472 coupled to a second power regulator 1474. The second power regulator 1474 is coupled such that a power source is provided to the actuator sampling module 1410, the input sensing module 1412, the processing module 1414, the second status indicator 1432, the diagnostic output module 1490 and the output sampling module 1492.

An input signal at the input ports 1422 and 1423 may be provided by an external relay controller that switches based on parameters such as temperature, voltage or current. The controller may be, but is not limited to, a temperature controller, a programmable logic controller etc.

The relay 1400 further comprises output ports 1480 and 1482. The output ports 1480 and 1482 may be connected to a power supply external the relay 1400 and an external load. The relay 1400 may be switched to allow the power supply external the relay 1400 to be connected to the external load. That is, the relay 1400 may switch states between "switch to connect" and "switch to disconnect".

The processing module 1414 comprises a micro-processor.

The switching module 1416 comprises a first diode 1418 that functions as an opto-coupler to a second diode 1420 connected at the output end of the relay 1400. The second diode 1420 may be a photosensitive diode.

The first status indicator 1440 may be a light-emitting diode. The second status indicator 1432 may also be a light-emitting diode.

The switching member/element 1450 may comprise a thyristor, a transistor, a MOSFET, a TRIAC, or any combination of such components.

In the example embodiment, the input sensing module 1412 is used for sensing power provided by an input connected at the input ports 1422 and 1423 or power provided by the auxiliary power supply. The output sampling module 1492 is used for sensing a voltage difference between the output ports 1480 and 1482.

In the example embodiment, the input signal at the input ports 1422 and 1423 may cause the switching module 1416 to switch the relay's state, for example, via optically coupling a received logic high signal (e.g. 3V, 5V) between the first diode 1418 and the second diode 1420 to cause a conduction effect at the switching member/element 1450, to, for example, connect/disconnect the output ports 1480 and 1482. For example, an input signal may control connection/disconnection between a power supply external the relay 1400 connected at the output port 1480 and an external load connected at the output port 1482, thus delivering power to the external load.

During a normal operation of the relay 1400, when an input voltage at the input port 1422 changes from ground to high (e.g. 5V), the first status indicator 1440 is switched on via the first power regulator 1460, (e.g. from ground to Vcc). The input signal is transmitted to the first diode 1418 and the first diode 1418 in turn switches on. An opto-coupling effect is achieved at the second diode 1420 and switches the conduction state of the switch member/element 1450. Thus, the input signal 1422 functions as a switching signal or a switch trigger signal. The switching module 1416 may cause the switching member/element 1450 to switch between a "switch to connect" and a "switch to disconnect" state, based on the switching signal. For example, when the first status indicator is switched on and the switching member/element 1450 is switched to connect, power is delivered from the power supply external to the relay 1400 (connected at the output port 1480) to the external load (connected at the output port 1482). The state of the switching member/element 1450 is configured to being the state of the relay 1400.

In the example embodiment, the output sampling module 1492 samples the output voltage drop between the output ports 1480 and 1482. The value of the output voltage drop is transmitted to the processing module 1414. The processing module 1414 instructs the second status indicator 1432 to change to a third mode, a fourth mode, a fifth mode, a sixth mode or a seventh mode according to an exemplary table as shown in Table 1A.

In the example embodiment, the diagnostic output module 1490 provides a diagnosis output to inform a user about the condition or diagnostic of the solid state relay, for example by raising an alarm signal. The alarm signal may be based on the condition or diagnostics indicated with the second status indicator 1432. As long as power is provided either at the auxiliary power supply 1470 or at the input ports 1422 and 1423, the processing module 1414 can instruct a test or condition diagnostics to be performed. For example, if power is being provided but yet the input sensing module 1412 indicates a low signal sensed, the processing module 1414 may determine that the solid state relay is internally short-circuited at the input. If the power provided is 3V, and the output sampling module 1492 indicates 0V, the processing module 1414 may determine that the solid state relay is externally short-circuited at the output. If power provided is 3V, and the output sampling module 1492 indicates more than 3V, the processing module 1414 may determine that there is an open circuit at the output (e.g. the output supply is removed or the output load is removed/cut). An alarm may be generated when an abnormal operation mode in the solid state relay is detected.

In the example embodiment, the actuator sampling module 1410 is used for manually instructing the processing module 1414 to activate (using logic high signal) the first status indicator 1440 and the switching module 1416 (e.g. when the input signal at the input port 1422 is not present). The processing module 1414 differentiates the input signal 1422 generated by the controller, and the signals generated by the actuator sampling module 1410 by the status of a flag (e.g. an input signal flag status or a connectivity test status flag). If the command or signal is from the actuator sampling module 1410, a connectivity test signal is flagged, as compared to an input signal flag which is generated when an input signal is sensed at the input port 1422.

It will be appreciated that, in alternative example embodiments, the actuator sampling module 1410 may be modified to be connected directly to the switching module 1416. The switching module 1416 may be modified to differentiate the input signal received at the input port 1422, and the signals generated by the actuator sampling module 1410 by flag status (e.g. an input signal flag or a connectivity test status flag). An example implementation is with reference to FIGS. 17(*a*) and 17(*b*).

In the example embodiment, the auxiliary power supply 1470 and the power supply module 1404 are configured to be connected to the actuator sampling module 1410, the input sensing module 1412, the processing module 1414, the second status indicator 1432, the diagnostic output module 1490 and the output sampling module 1492. When an input signal (at the input port 1422) is not present and the auxiliary power supply 1470 is switched on and connected, for example, to a power connector and port 1423, the actuator sampling module 1410 is capable of sending a signal to the processing module 1414 to transmit a toggle signal to switch on the first status indicator 1440 and to activate the switching module 1416 to in turn switch the state of the switching member/element 1450 (e.g. optically between the first diode 1418 and the second diode 1420).

For example, a circuit between a power supply external to the relay 1400 (connected at the output port 1480) and an external load (connected at the output port 1482) closes and power is delivered from the power supply external to the relay 1400 to the external load.

When a switch actuator (e.g. switch actuator 1304) is in a normal or down position, no signal is sent to the processing module 1414 when the auxiliary power supply is switched on. When the switch actuator (e.g. switch actuator 1304) is in an up position, a signal is sent to the processing module 1414 when the auxiliary power supply is switched on.

In a normal operation of a solid state relay, the relay switches state (e.g. from a "switch to disconnect" state to a "switch to connect" state) when an external relay controller coupled to the input ports of the relay sends a signal to the relay. The input signal is coupled (e.g. via optical means) as a switching signal to turn on an output switch as the state of the switching member/element 1450.

Advantageously, to determine whether the solid state relay is operating normally, the user need not wait for an external relay controller to be readily connected at the input ports of the relay, which helps to save time in setting up the systems.

Table 1A below shows an exemplary table for a solid state relay in an example embodiment of FIG. 14.

TABLE 1A

| | User Control | | | | | Indication/Diagnosis Information | | |
|---|---|---|---|---|---|---|---|---|
| Number | Input Signal at input ports 1422 and 1423 | Switch Actuator 1304) | In_Logic Input Sensing Module 1412 | Vdrop Output Sampling Module 1492 | First Status Indicator 1440 | Second Status Indicator 1432 | Diagnostic Output Module 1490 | Explanation of Diagnosis Information |
| 1 | Applied | Not relevant | High | =<3 V | ON | Orange ON (Third mode) | 0 VDC | Solid state relay is in normal operating mode (no problem) |
| 2 | Applied | Not relevant | Low | =<3 V | ON | Red ON (Fourth mode) | 4 . . . 32 VDC | Solid state relay input short-circuited |
| 3 | Applied | Not relevant | High | 0 V | ON | Red Fast Flashing (5% ON; 95% OFF) (Fifth mode) | 4 . . . 32 VDC | Solid state relay output external short-circuited mode) |
| 4 | Applied | Not relevant | High | >3 V | ON | Red Slow Flashing (80% ON; 20% OFF) (Sixth mode) | 4 . . . 32 VDC | Solid state relay output supply removed |
| 5 | Applied | Not relevant | High | >3 V | ON | Red Slow Flashing (80% ON; 20% OFF) (Seventh mode) | 4 . . . 32 VDC | Solid state relay output load removed/cut |
| 6 | Removed | Actuated (Hold) | High | =<3 V | ON | Orange ON (Third mode) | 0 VDC | Solid state relay is in normal operating mode (no problem) |
| 7 | Removed | Actuated (Hold) | Low | =<3 V | ON | Red ON (Fourth mode) | 4 . . . 32 VDC | Solid state relay input short-circuited |
| 8 | Removed | Actuated (Hold) | High | 0 V | ON | Red Fast Flashing (5% ON; 95% OFF) (Fifth mode) | 4 . . . 32 VDC | Solid state relay output external short-circuited |
| 9 | Removed | Actuated (Hold) | High | >3 V | ON | Red Slow Flashing (80% ON; 20% OFF) (Sixth mode) | 4 . . . 32 VDC | Solid state relay output supply removed |
| 10 | Removed | Actuated (Hold) | High | >3 V | ON | Red Slow Flashing (80% ON; 20% OFF) (Seventh mode) | 4 . . . 32 VDC | Solid state relay output load removed/cut |
| 11 | Removed | Not Actuated | High | =<3 V | OFF | OFF | 0 VDC | No circuitry problem detected with the solid state relay |

TABLE 1A-continued

| | User Control | | | | Indication/Diagnosis Information | | | |
|---|---|---|---|---|---|---|---|---|
| | Input Signal at | | In_Logic | Vdrop | | | | |
| Number | input ports 1422 and 1423 | Switch Actuator 1304) | Input Sensing Module 1412 | Output Sampling Module 1492 | First Status Indicator 1440 | Second Status Indicator 1432 | Diagnostic Output Module 1490 | Explanation of Diagnosis Information |
| 12 | Removed | Not Actuated | Low | =<3 V | OFF | Red ON (Fourth mode) | 4 . . . 32 VDC | Solid state relay input short-circuited |
| 13 | Removed | Not Actuated | High | 0 V | OFF | Red Fast Flashing (5% ON; 95% OFF) (Fifth mode) | 4 . . . 32 VDC | Solid state relay output external short-circuited |
| 14 | Removed | Not Actuated | High | >3 V | OFF | Red Slow Flashing (80% ON; 20% OFF) (Sixth mode) | 4 . . . 32 VDC | Solid state relay output supply removed |
| 15 | Removed | Not Actuated | High | >3 V | OFF | Red Slow Flashing (80% ON; 20% OFF) (Seventh mode) | 4 . . . 32 VDC | Solid state relay output load removed/cut |

Item numbers 1 to 5 show the behavior of the second status indicator and the respective diagnosis information for the solid state relay corresponding to different sets of conditions sensed by the input sensing module 1412 and the output sampling module 1492, together with input signals being provided at input ports 1422 and 1423. When input signals are provided at input ports 1422 and 1423, signals from a switch actuator (e.g., switch actuator 1304) is prevented from switching the state of the solid state relay. At the same time, the first status indicator 1440 is in an "ON" state to indicate the presence of input signals at input ports 1422 and 1423.

As shown in item number 1, if the solid state relay is in a normal operating mode i.e. there is no problem detected with the solid state relay, the second status indicator 1432 shows an orange colored light. In this situation, the input sensing module 1412 senses a logic high signal since input signals are provided at input ports 1422 and 1423, and the output sampling module 1492 senses an output voltage drop of less than or equal to 3V. The processing module 1414 instructs the diagnostic output module to generate 0 VDC (or DV voltage). Therefore, no alarm is generated.

As shown in item number 2, if the solid state relay is detected to be input short-circuited, the second status indicator 1432 shows a red colored light. In this situation, the input sensing module 1412 senses a logic low signal since the solid state relay is input short-circuited. The processing module 1414 instructs the diagnostic output module 1490 to generate 4 VDC, 8 VDC, 16 VDC or 32 VDC to generate an alarm.

As shown in item number 3, if the solid state relay is detected to be output external short-circuited, the second status indicator 1432 shows a fast flashing red colored light (5% ON and 95% OFF in a given period of time). In this situation, the output sampling module 1492 senses a 0 V voltage drop which equates to a short-circuit. The processing module 1414 instructs the diagnostic output module 1490 to generate 4 VDC, 8 VDC, 16 VDC or 32 VDC to generate an alarm.

As shown in item numbers 4 and 5, if the supply of the load at the output of the solid state relay is removed or if the output load of the solid state relay is removed, the second status indicator 1432 shows a slow flashing red colored light (80% ON and 20% OFF in a given period of time). In this situation, the output sampling module 1492 senses a voltage drop of greater than 3 V. The processing module 1414 instructs the diagnostic output module 1490 to generate 4 VDC, 8 VDC, 16 VDC or 32 VDC to generate an alarm.

Item numbers 6 to 10 show the behaviour of the second status indicator and the respective diagnosis information for the solid state relay corresponding to different sets of conditions sensed by the input sensing module 1412 and the output sampling module 1492, when input signals are not provided at input ports 1422 and 1423.

The auxiliary power supply 1470 is provided, and the switch actuator (e.g., switch actuator 1304) is actuated to simulate the presence of input signals. As such, the first status indicator 1440 is in an "ON" state.

As shown in item number 6, if the solid state relay is in a normal operating mode i.e. there is no problem detected with the solid state relay, the second status indicator 1432 shows an orange colored light. In this situation, the input sensing module 1412 senses a logic high signal since auxiliary power supply 1470 is being provided and the switch actuator is activated, and the output sampling module 1492 senses an output voltage drop of less than or equal to 3V. The processing module 1414 instructs the diagnostic output module to generate 0 VDC (or DC voltage). Therefore, no alarm is generated.

As shown in item number 7, if the solid state relay is detected to be input short-circuited, the second status indicator 1432 shows a red colored light. In this situation, the input sensing module 1412 senses a logic low signal since the solid state relay is input short-circuited. The processing module 1414 instructs the diagnostic output module 1490 to generate 4 VDC, 8 VDC, 16 VDC or 32 VDC to generate an alarm.

As shown in item number 8, if the solid state relay is detected to be output external short-circuited, the second status indicator 1432 shows a fast flashing red colored light (5% ON and 95% OFF in a given period of time). In this situation, the output sampling module 1492 senses a 0 V voltage drop which equates to a short-circuit. The processing module 1414 instructs the diagnostic output module 1490 to generate 4 VDC, 8 VDC, 16 VDC or 32 VDC to generate an alarm.

As shown in item numbers 9 and 10, if the supply of the load at the output of the solid state relay is removed or if the output load of the solid state relay is removed, the second status indicator 1432 shows a slow flashing red colored light (80% ON and 20% OFF in a given period of time). In this situation, the output sampling module 1492 senses a voltage drop of greater than 3 V. The processing module 1414 instructs the diagnostic output module 1490 to generate 4 VDC, 8 VDC, 16 VDC or 32 VDC to generate an alarm.

Item numbers 11 to 15 show the behavior of the second status indicator and the respective diagnosis information for the solid state relay corresponding to different sets of conditions sensed by the input sensing module 1412 and the output sampling module 1492, when input signals are not provided at input ports 1422 and 1423.

The auxiliary power supply 1470 is provided, and the switch actuator (e.g., switch actuator 1304) is not actuated (i.e. the presence of input signals is not simulated). Therefore, the first status indicator 1440 is in an "OFF" state.

As shown in item number 11, if it is detected that there are no circuitry problems with the solid state relay, the second status indicator 1432 is in an OFF state. In this situation, the input sensing module 1412 senses a logic high signal since auxiliary power supply 1470 is being provided, and the output sampling module 1492 senses an output voltage drop of less than or equal to 3V. The processing module 1414 instructs the diagnostic output module 1490 to generate 0 VDC (or DC voltage). Therefore, no alarm is generated.

As shown in item number 12, if the solid state relay is detected to be input short-circuited, the second status indicator 1432 shows a red colored light. In this situation, the input sensing module 1412 senses a logic low signal since the solid state relay is input short-circuited. The processing module 1414 instructs the diagnostic output module 1490 to generate 4 VDC, 8 VDC, 16 VDC or 32 VDC to generate an alarm.

As shown in item number 13, if the solid state relay is detected to be output external short-circuited, the second status indicator 1432 shows a fast flashing red colored light (5% ON and 95% OFF in a given period of time). In this situation, the output sampling module 1492 senses a 0 V voltage drop which equates to a short-circuit. The processing module 1414 instructs the diagnostic output module 1490 to generate 4 VDC, 8 VDC, 16 VDC or 32 VDC to generate an alarm.

As shown in item numbers 14 and 15, if the supply of the load at the output of the solid state relay is removed of if the output load of the solid state relay is removed, the second status indicator 1432 shows a slow flashing red colored light (80% ON and 20% OFF in a given period of time). In this situation, the output sampling module 1492 senses a voltage drop of greater than 3 V. The processing module 1414 instructs the diagnostic output module 1490 to generate 4 VDC, 8 VDC, 16 VDC or 32 VDC to generate an alarm.

It will be appreciated that the sensing of the condition or diagnostics may indicate electrical performance of the solid state relay while the switch actuator advantageously allows a user to test switching a state of the relay, for example, to affect an output load of the relay.

FIGS. 11(*a*) and (*b*) are schematic circuit diagrams illustrating an example implementation of the detent switch 330 for facilitating generation of an electrical toggle signal to a switching module for a relay in an example embodiment. In the example implementation, the switching module comprises the trigger module 316 and the switching element/member 350.

FIG. 11(*a*) shows the detent switch 330 in an open position. The actuator sampling module 310 comprises a resistor pair R1, R2 arranged between a Vcc signal and a ground signal. When the detent switch 330 is in the open position (i.e. the trigger actuator is in the normal or down position), a high signal level (i.e. the Vcc voltage value) is transmitted and read at the processing module 314.

FIG. 11(*b*) shows the detent switch 330 in a closed position. When the detent switch 330 is in the closed position (i.e. the trigger actuator is in the up position), a low signal level (i.e. at ground level across the detent switch) is transmitted and read at the processing module 314. This signals the processing module 314 to activate the trigger module 316 (with a toggle trigger signal). Upon receiving the toggle trigger signal, the switching element/member 350 is instructed to switch states.

In the example implementation, the processing module 314 receives the signal from the actuator sampling module 310 at a dedicated input port for differentiating the signal to set flag statuses.

FIGS. 12(*a*) and (*b*) are schematic circuit diagrams illustrating another example implementation of the detent switch 330 for facilitating generation of an electrical toggle signal to a switching module for a relay in an example embodiment. In the example implementation, the detent switch 330 is modified to be connected directly to the trigger module 316. The switching module comprises the trigger module 316 and the switching element/member 350.

FIG. 12(*a*) shows the detent switch 330 in an open position. The actuator sampling module 310 comprises a resistor pair R1, R2 arranged between a Vcc signal and a ground signal. When the detent switch 330 is in the open position (i.e. the trigger actuator is in the normal or down position), a high signal level (i.e. the Vcc voltage value) is transmitted and read at the trigger module 316.

FIG. 12(*b*) shows the detent switch 330 in a closed position. When the detent switch 330 is in the closed position (i.e. the trigger actuator is in the up position), a low signal level (i.e. at ground level across the detent switch) is transmitted and read at the trigger module 316. This provides an electrical toggle signal for the trigger module 316 to instruct the switching element/member 350 to switch states.

In the example implementation, the trigger module 316 receives the signal from the actuator sampling module 310 at a dedicated input port, different from an input port for connection to the processing module 314, for differentiating the signal from the actuator sampling module 310 to set flag statuses.

Figure 16A:
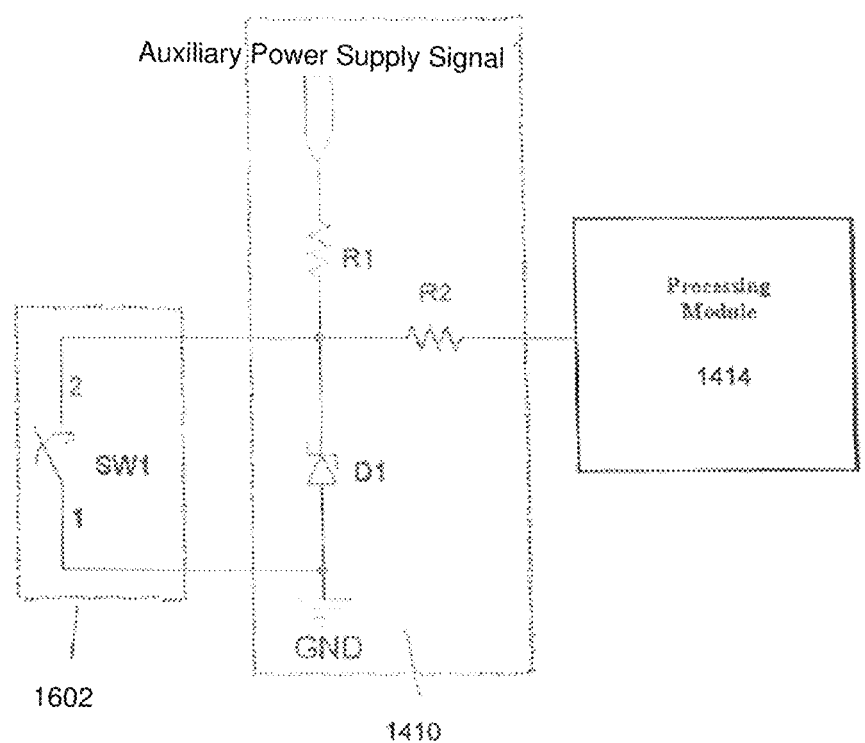
FIGS. 16(a)-16(b) are schematic circuit diagrams illustrating an example implementation of a detent switch for facilitating generation of an electrical toggle signal to a switching module for a relay in an example embodiment.
Figure 16B:
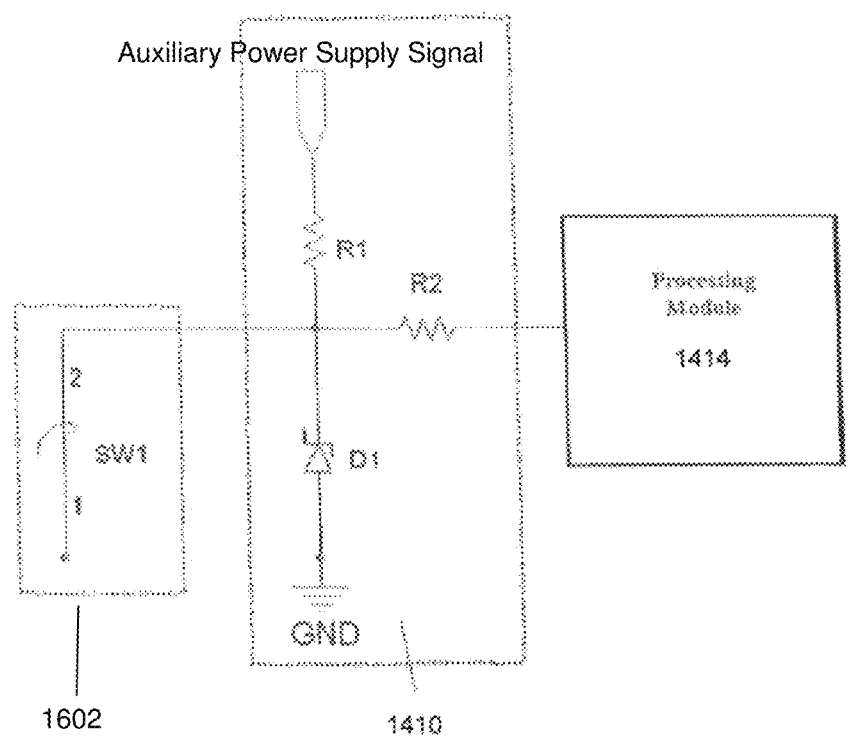

FIGS. 16(*a*) and (*b*) are schematic circuit diagrams illustrating an example implementation of a detent switch 1602 for facilitating generation of an electrical toggle signal to a switching module for a relay in an example embodiment. In the example implementation, the switching module 1416 comprises a switching member/element 1450 coupled to the switching module 1416.

FIG. 16(*a*) shows the detent switch 1602 in an open position. The actuator sampling module 1410 comprises a resistor pair R1, R2 arranged between an auxiliary power supply signal (e.g. from a power regulator such as second power regulator 1474) and a ground signal. When the detent switch 1602 is in the open position (e.g., when switch actuator 204 or switch actuator 1304 is in the normal or down position), no signal is transmitted and read at the processing module 1414.

FIG. 16(*b*) shows the detent switch 1602 in a closed position. When the detent switch 1602 is in the closed position (e.g., when switch actuator 204 or switch actuator 1304 is in the up position), a signal is transmitted and read at the processing module 1414 when the auxiliary power supply (e.g. auxiliary power supply 1470) is switched on. This signals the processing module 1414 to activate the switching module 1416 (with a toggle signal). Upon receiving the toggle signal, the switching element/member 1450 is instructed to switch states.

In the example implementation, the processing module 1414 receives the signal from the actuator sampling module 1410 at a dedicated input port for differentiating the signal to set flag statuses.

Figure 17A:
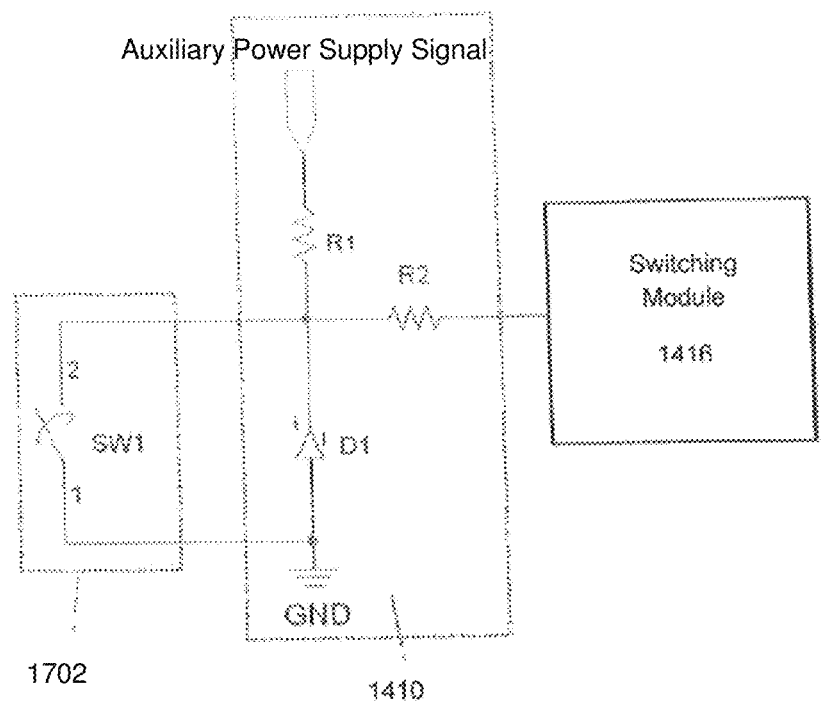
FIGS. 17(a)-17(b) are schematic circuit diagrams illustrating another example implementation of a detent switch for facilitating generation of an electrical toggle signal to a switching module for a relay in an example embodiment.
Figure 17B:
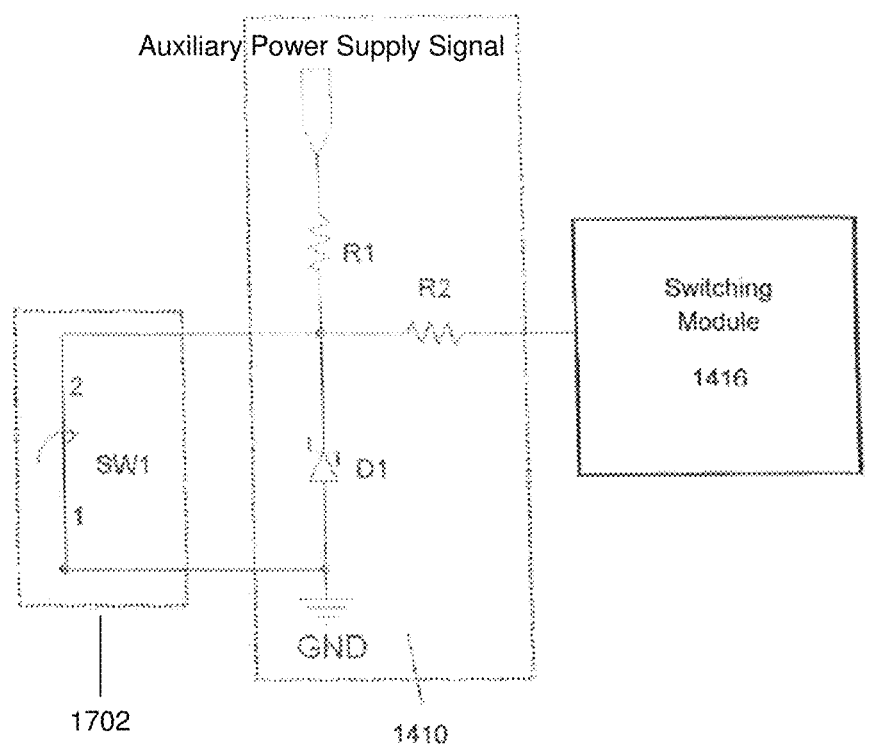

FIGS. 17(*a*) and (*b*) are schematic circuit diagrams illustrating another example implementation of the detent switch 1702 for facilitating generation of an electrical toggle signal to a switching module for a relay in an example embodiment. In the example implementation, the detent switch 1702 is modified to be connected directly to the switching module 1416. The switching module 1416 comprises a switching member/element 1450 coupled to the switching module 1416.

FIG. 17(*a*) shows the detent switch 1702 in an open position. The actuator sampling module 1410 comprises a resistor pair R1 and R2 arranged between an auxiliary power supply signal (e.g. from a power regulator such as second power regulator 1474) and a ground signal. When the detent switch 1430 is in the open position, i.e. the switch actuator 204 or switch actuator 1304 is in the normal or down position, no signal is transmitted and read at the switching module 1416.

FIG. 17(*b*) shows the detent switch 1702 in a closed position. When the detent switch 1702 is in the closed position, (e.g., the switch actuator 204 or switch actuator 1304 is in the up position), a signal is transmitted and read at the switching module 1416 when the auxiliary power supply 1470 is switched on. This provides an electrical toggle signal for the switching module 1416 to instruct the switching element/member 1450 to switch states.

In the example implementation, the switching module 1416 receives the signal from the actuator sampling module 1410 at a dedicated input port, different from an input port for connection to the processing module 1414, for differentiating the signal from the actuator sampling module 1410 to set flag statuses.

Table 1 below shows the switching logic of different relays.

TABLE 1

| Power Supply | Input | Actuator | Output Relay Status | | | |
|---|---|---|---|---|---|---|
| | | | 3-Phase | Voltage | Current | Level |
| ON | Normal | Down position | Energized | Energized | Energized | Energized |
| | | Up position | De-energized | De-energized | De-energized | De-energized |
| ON | Fault | Down position | De-energized | De-energized | De-energized | De-energized |
| | | Up position | De-energized | De-energized | De-energized | De-energized |
| OFF | Normal or Fault | Down position or Up position | No action | No action | No action | No action |

The relays may be electronic relays monitoring, for example, 3-phase voltages, voltage levels, current levels, fluid levels, etc. If there is no fault detected, moving the trigger actuator switches a state of a relay. If there is an actual fault detected, moving the trigger actuator has no switching effect on the relay. If the relay is not powered, moving the trigger actuator has no switching effect on the relay.

TABLE 2

Table 2 below shows the switching logic of a timer relay.

| Power Supply | Input Control Signal | Actuator | Output Relay Status for a Timer Relay (Multi/Single Function) |
|---|---|---|---|
| ON | Any | Down position | Follows operation of timing function selected (restart the timing function upon changing the actuator to a down position) |
| | | Up position | Energised |
| OFF | Any | Down position | No action |
| | | Up position | No action |

In yet another example embodiment, an electronic relay may be a timer relay with, for example, a multiple or single timing function. During a normal (or non-condition triggered) operation for the timer relay, when the relay is powered or switched on, the timer relay and its switching member are in, for example, a de-energized state. The timer relay operates according to a predetermined timing function that is being monitored by its processing module. For example, the processing module instructs a switching element of the relay to switch from a de-energized state to an energized state after a predetermined time (such as 15 seconds) has elapsed as monitored by the processing module. For example, follow-up actions may be arranged to be taken (e.g. an alarm may be raised or operation of a machinery may be stopped).

In the example embodiment, if the trigger actuator (e.g., trigger actuator 104 or trigger actuator 204) is moved to an up position, the circuit connecting the detent switch to the actuator sampling module becomes closed. The actuator sampling module is activated and sends a toggle signal to the processing module. The processing module flags a connectivity test status and sends a signal to a trigger module to switch the switching member. The switching member switches from being in a de-energized state to an energized state (e.g. the switching member switches from being connected to a normally closed (NC) state to a normally open (NO) state). That is, the relay is caused to switch (e.g. from a de-energized state to an energized state) regardless of the actual time elapsed. If the connectivity of the circuit/system that the relay is part of is operating normally, the user may observe that the follow-up actions due to a trigger or a switch in the relay occur accordingly. If the follow-up actions do not occur, the user may conclude that the connectivity of the circuit/system is faulty.

In the example embodiment, when the trigger actuator (e.g., trigger actuator 104 or trigger actuator 204) is moved to the down or normal position, the connectivity test flag is cleared at the processing module, and the processing module switches the state of the switching member (e.g. back to a de-energized state), and restarts the predetermined timing function (e.g. 15 seconds).

Figure 4:
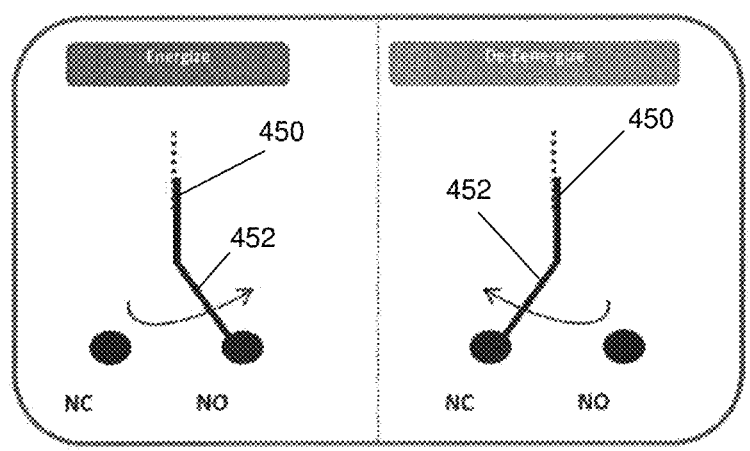
FIG. 4 shows a schematic diagram of a switching member in an energized state and a de-energized state.

FIG. 4 shows a schematic diagram of a switching member 450 in an energized state and a de-energized state. When the switching member 450 switches to an energized state, a contact 452 of the switching member 450 is switched to connect to the normally open (NO) contact. When the switching member 450 switches to a de-energized state, the contact 452 of the switching member 450 is switched to connect to the normally close (NC) contact.

FIGS. 5(a) to 5(d) show the positions of a switching member of a relay during monitoring of an input condition in an example embodiment.

Figure 5:
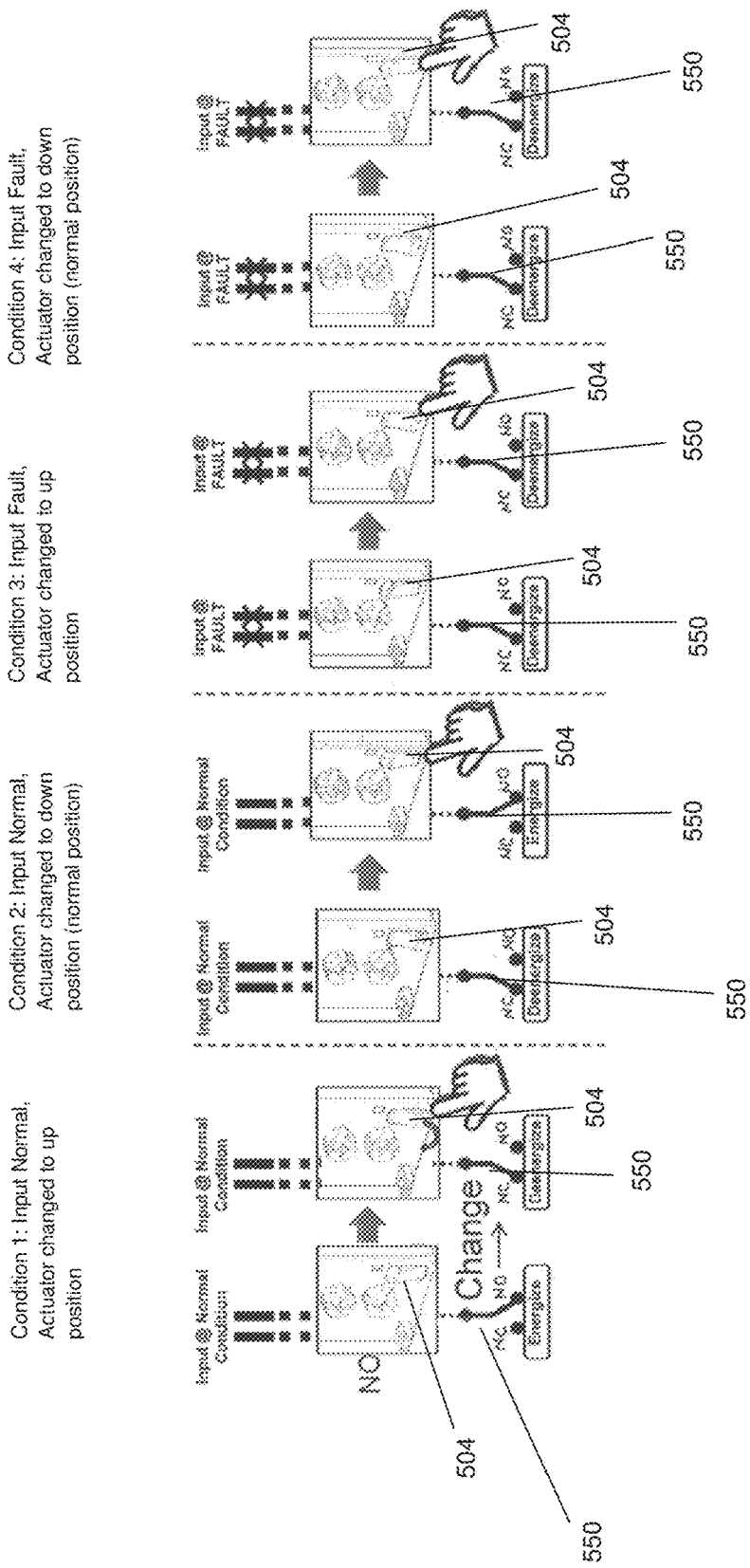
FIGS. 5(a)-5(d) show the positions of a switching member of a relay during monitoring of an input condition in an example embodiment.

At FIG. 5(a), when the relay is being powered and a trigger actuator 504 is in a down position, a switching member 550 is connected to a normally open (NO) contact to be in an energized state and the relay is in an energized state for a normal (non-fault) input. To begin a connectivity test for the relay, a user moves the trigger actuator 504 to an up position. A processing module of the relay flags a connectivity test status. The switching member 550 switches to a normally closed (NC) contact, and switches to a de-energized state. That is, the relay switches states and is caused to switch from an energized state to a de-energized state. If the connectivity of the circuit/system that the relay is part of is operating normally, the user may observe that the follow-up actions due to a trigger or a switch thereby occur accordingly. If the follow-up actions do not occur, the user may conclude that the connectivity of the circuit/system is faulty. The user may therefore also know that the relay is operating normally.

At FIG. 5(b), when the user wishes to end the connectivity test, the trigger actuator 504 is moved from the up position to the down position. A processing module of the relay determines that a fault status flag is not present and removes the connectivity test status flag and the connectivity test ends. The switching member 550 returns to being connected to the NO contact from the NC contact, and switches to an energized state. That is, the relay switches states and is caused to switch from a de-energized state to an energized state. Thereafter, normal operation of or monitoring of the relay circuit resumes.

At FIG. 5(c), when the relay is being powered on and if there is a detected fault in the input condition monitored by the relay, the relay switches to the de-energized state. A processing module flags a fault condition/status. In the example embodiment, the relay is prevented from changing from the de-energized state to an energized state. At this time, the switching member 550 is in a de-energized state and is connected to the NC contact. Even if a user moves the trigger actuator 504 to an up position to attempt to begin a connectivity test on the relay or to switch the relay, the switching member 550 remains connected to the NC contact and remains in a de-energized state based on the fault status flag at the processing module. The relay remains in a de-energized state. This safety feature may ensure that moving the trigger actuator 504 cannot cause the relay to switch states (e.g. to an energized state) when there is an actual detected fault in the input condition monitored by the relay.

At FIG. 5(d), it is shown that if there is a detected fault in the input condition monitored by the relay, a user moving the trigger actuator 504 from an up position to a down position (or vice versa from FIG. 5(c)), the switching member 550 remains connected to the NC contact and remains in a de-energized state based on the fault status flag at the processing module. The relay remains in a de-energized state.

Figure 6:
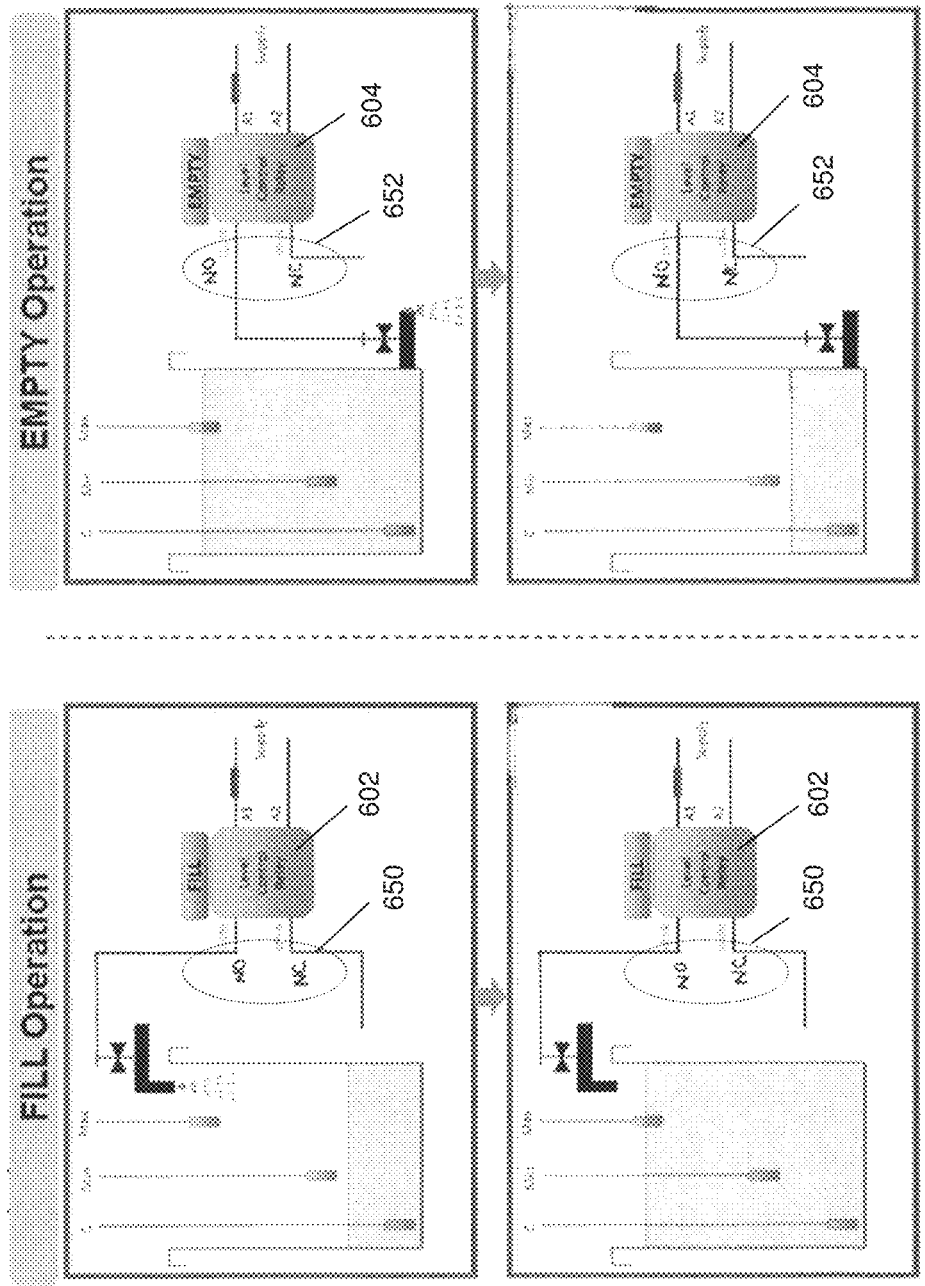
FIG. 6(a) shows a schematic diagram illustrating a relay monitoring a fluid level in a fill operation in an example embodiment.
FIG. 6(b) shows a schematic diagram illustrating a relay monitoring a fluid level in an empty operation in an example embodiment.

FIG. 6(a) shows a schematic diagram illustrating a relay monitoring a fluid level in a fill operation in an example embodiment. That is, the relay 602 is configured to trigger to switch states when the fluid level reaches a predetermined maximum level. When the relay 602 is powered on and the input condition being monitored is normal (non-condition triggered), the relay 602 is in an energized state and fluid is allowed to flow for filling a tank. At this time, a switching member 650 connects to a normally open contact. If a user moves a trigger actuator of the relay 602 to an up position to begin a connectivity test, a processing module flags a connectivity test status. Based on an instruction from the processing module, the switching element 650 of the relay 602 switches states (e.g. to a normally closed contact), and fluid flow is stopped. This may show the user that the connectivity of the fill circuit/system/mechanism is operating normally.

Conversely, if a user moves a trigger actuator to an up position to begin a connectivity test but fluid continues to flow into the tank, the user may conclude that the connectivity of the fill circuit/system/mechanism is faulty. Also, if the switching member 650 does not switch states (e.g. remains connected to the normally open contact), the user may conclude that the relay is faulty.

However, in the example embodiment, when a pre-determined maximum fluid level is already reached and the relay 602 has switched states (e.g. to a de-energized state), the processing module flags a condition trigger/fault condition and the trigger actuator is prevented from causing the switching member 650 to switch states (e.g. to the energized state), even if a user moves the trigger actuator to an up position. The switching member 650 remains connected to the normally closed contact based on the condition trigger/fault flag in the processing module. This functions as a safety feature to ensure that a user is not able to cause more fluid to continue to flow into a tank by moving a trigger actuator of a level control relay to an up position to switch the relay, when a predetermined maximum liquid level is already reached. The safety feature may prevent overflowing of the fluid out of the tank, which may be otherwise dangerous especially for hazardous fluids.

FIG. 6(b) shows a schematic diagram illustrating a relay monitoring a fluid level in an empty operation in an example embodiment. When the relay 604 is powered on and the input condition being monitored is normal (non-condition triggered), the relay 604 is in an energized state. A switching member 652 connects to a normally open contact and fluid is allowed to flow out of a tank. If a user moves a trigger actuator of the relay 604 to an up position to begin a connectivity test, a processing module flags a connectivity test status. Based on an instruction from the processing module, the switching member 652 switches states (e.g. to a normally closed contact), and fluid flow is stopped. Fluid is no longer allowed to flow out of the tank. This may show the user that the connectivity of the empty circuit/system/mechanism is operating normally.

Conversely, if the user moves a trigger actuator to an up position to begin a connectivity test when the relay 604 is in an energized state but the fluid continues to flow out of the tank, the user may conclude that the connectivity of the empty circuit/system/mechanism is faulty. Also, if the switching member 652 does not switch states (e.g. the switching member 652 remains connected to the normally open contact), and does not switch to the de-energized state, the user may conclude that the relay is faulty.

However, in the example embodiment, when a pre-determined minimum fluid level is already reached or when the fluid level is already below the pre-determined minimum level and the relay 604 has switched states (e.g. to a de-energized state), the processing module flags a condition trigger/fault condition and the trigger actuator is prevented from causing the switching member 652 to switch states even if a user moves the trigger actuator to an up position. The switching member 652 remains connected to the normally closed contact and in a de-energized state based on the condition trigger/fault flag in the processing module. This functions as a safety feature to ensure that a user is not able to cause fluid to continue to flow out of a tank by moving a trigger actuator of a level control relay to an up position to switch the relay 604, when a predetermined minimum fluid level is already reached or exceeded.

The safety feature may prevent the fluid from being caused to flow out of the tank by movement of the trigger actuator when a predetermined minimum liquid level is already reached or exceeded.

Figure 7:
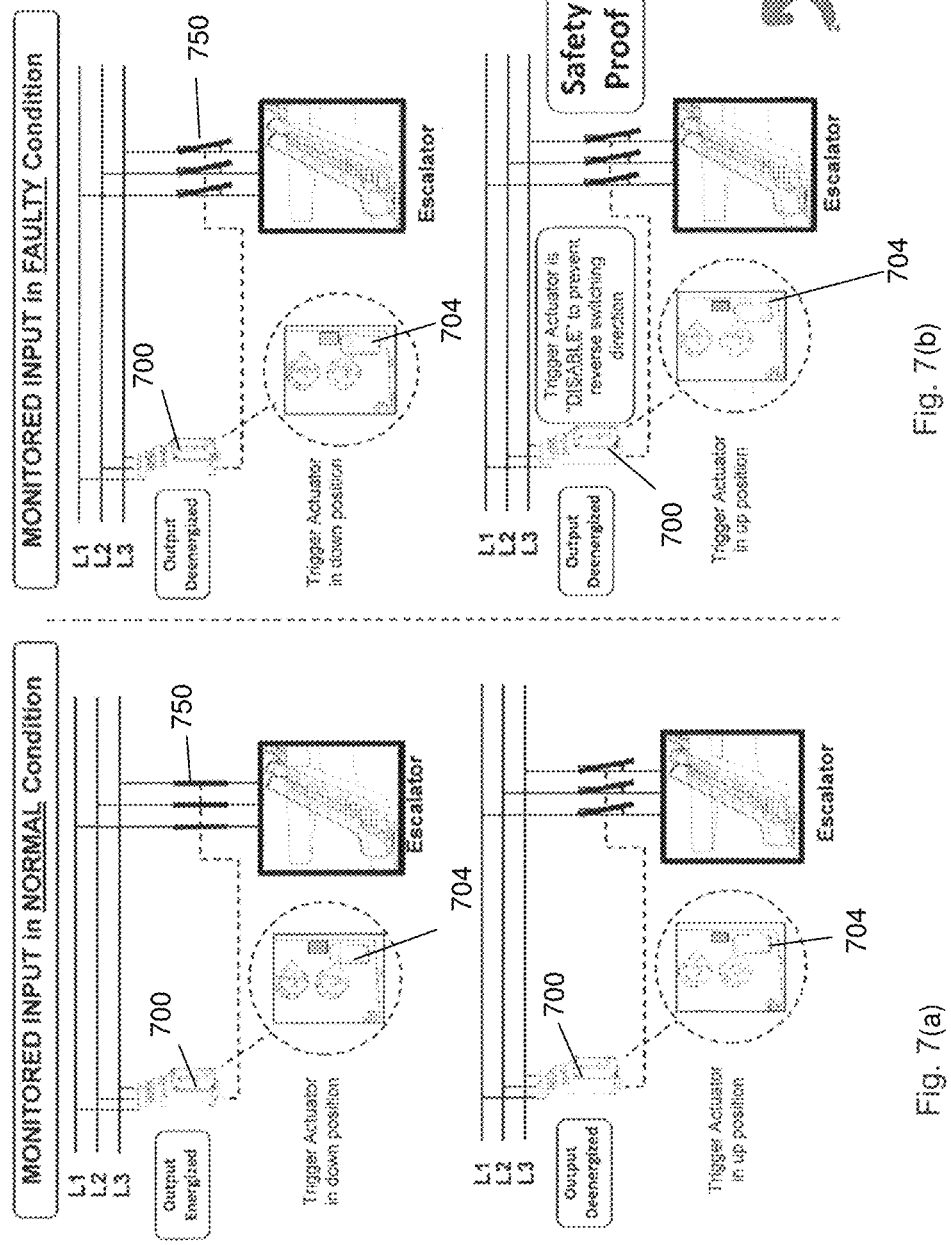
FIGS. 7(a)-7(b) show schematic diagrams illustrating a three-phase control relay in an example embodiment.

FIGS. 7(*a*) and 7(*b*) show schematic diagrams illustrating a three-phase control relay in another example embodiment. The three-phase control relay may be for use in for example, but not limited to, an escalator.

At FIG. 7(*a*), when the relay 700 is powered on and if the input condition being monitored is normal (non-fault), the relay 700 is in an energized state. Each switching member 750 switches to, for example, a normally open contact and is in an energized state. At this time, a trigger actuator 704 may be in a down position. A user moves the trigger actuator 704 to an up position in order to begin a connectivity test on the relay 700. A processing module flags a connectivity test status. Each switching member 750 is instructed via the processing module to switch to a normally closed (NC) contact and to switch to a de-energized state. The relay 700 switches to a de-energized state. The escalator stops working and the user may therefore know that the connectivity of the circuit/system connected to the three-phase control relay 700 is operating normally.

Conversely, if the user moves the trigger actuator 704 to an up position to begin a connectivity test but if the escalator does not stop, the user may conclude that the connectivity of the circuit/system is faulty or not operating normally. Also, if one or more of the switching members (e.g. 750) remain connected to the normally open contact and the relay 700 is not switched to a de-energized state, the user may conclude that the relay is faulty.

At FIG. 7(*b*), when the relay 700 is powered on and if the input condition being monitored is abnormal or faulty, the relay 700 switches to a de-energized state. For example, the escalator has stopped. The processing module of the relay flags a fault condition status. Each switching member 750 remains connected to a normally closed contact. At this time, a trigger actuator 704 may be in a down position. If a user moves the trigger actuator 704 to an up position, each switching member (e.g. 750) remains connected to the normally closed (NC) contact or there is no switching effect. The relay 700 remains in a de-energized state based on the fault condition flag at the processing module. This functions as a safety feature to prevent the trigger actuator 704 from causing the relay 700 to switch states (e.g. to an energized state) when the relay 700 detects a fault at the input condition.

Figure 8:
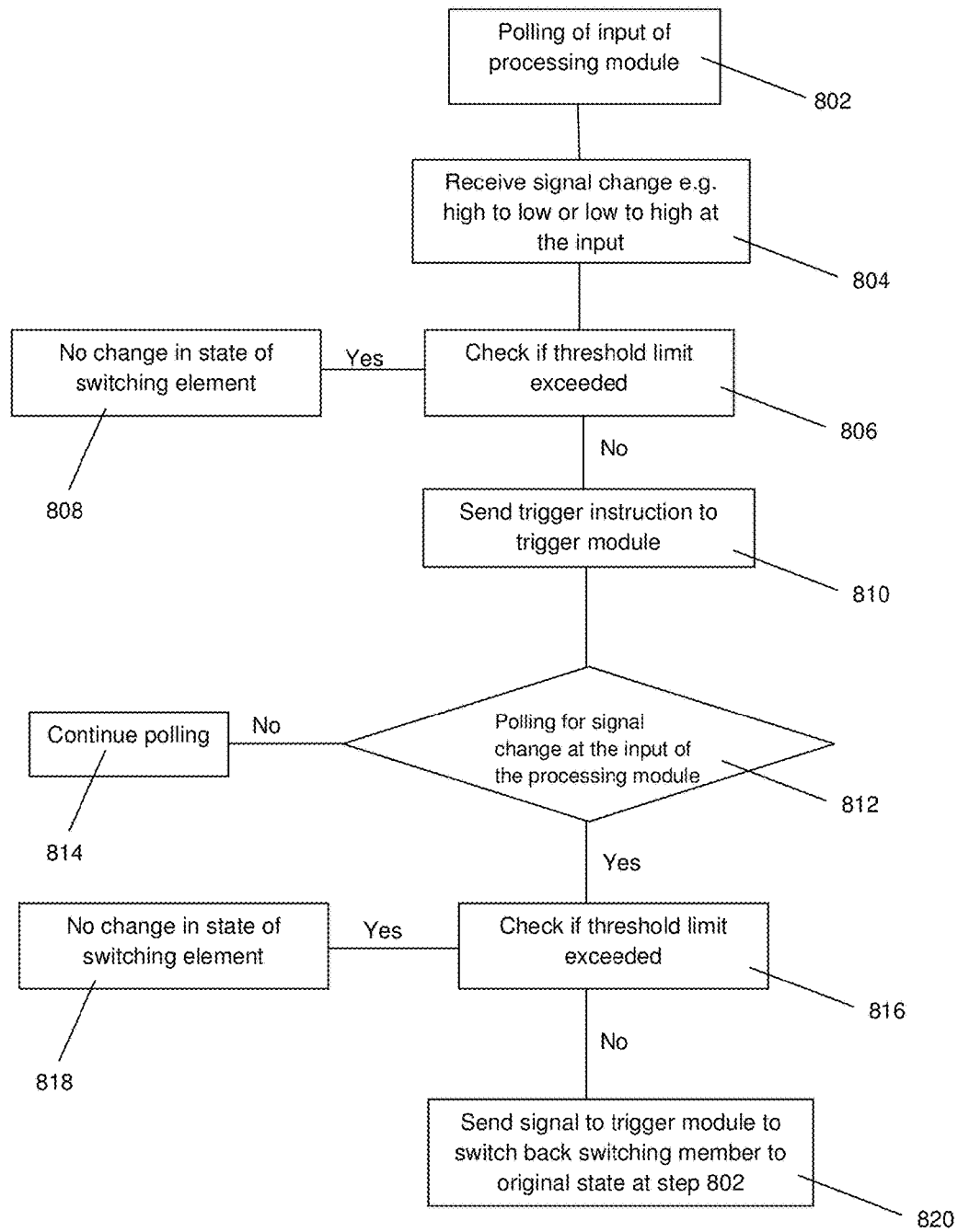
FIG. 8 is a schematic flow diagram for illustrating a connectivity test for an electronic relay in an example embodiment.

FIG. 8 is a schematic flow diagram for illustrating a connectivity test for an electronic relay in an example embodiment.

At step 802, polling of an input of a processing module of the relay is conducted. The input of the processing module is connected to an actuator sampling module of the relay. In alternative example embodiments, the actuator sampling module may be connected directly to a switching module comprising a trigger module and a switching element/member.

At step 804, a signal change at the input of the processing module is detected (e.g. from high to low or from low to high). This may result from the closing of a contact between a detent switch and an actuator sampling module (e.g. by moving a trigger actuator to an up position). That is, the detent switch receives a mechanical input via the trigger actuator.

At step 806, the processing module conducts a check to determine whether one or more predetermined conditions have been met, such as if one or more predetermined threshold limits transmitted from a setting module of the relay have been exceeded by inputs to the relays sampled by an input sampling module of the relay.

If the result is yes at step 806, (i.e. one or more predetermined threshold limits are exceeded), the signal change at step 804 is prevented from causing a switching member of the relay to switch state (e.g. from a de-energized state to an energized state) at step 808. In other words, a toggle signal is not sent to the switching module. Such a determination is taken as indicative of a fault of a condition trigger flag being generated at the processing module.

If the result is no at step 806, i.e. no predetermined threshold limit has been exceeded (i.e. non-condition triggered), the processing module sends a trigger instruction to a trigger module of the relay and the trigger module causes a switching member to change state (e.g. from an energized to a de-energized state at step 810). The signal change at step 804 is also taken as indicative of a connectivity test flag being generated at the processing module.

Thereafter, at step 812, polling for a signal change at the input of the processing module of the relay continues.

If no signal change is detected at the input of the processing module of the relay, for example the trigger actuator remains in the up position, the polling process continues (at step 814).

If a signal change is detected at the input of the processing module of the relay at step 812, for example the trigger actuator is moved from an up position to a down position, the processing module conducts a check to determine whether one or more predetermined threshold limits transmitted from the setting module of the relay are exceeded (at step 816).

If one or more predetermined threshold limits transmitted from the setting module of the relay are exceeded, at step 818, the signal change at step 812 is prevented from causing the switching element of the relay to switch states. Such a determination is taken as indicative of a fault of condition trigger flag being generated at the processing module.

If no predetermined threshold limit transmitted from the setting module of the relay is exceeded, at step 820, the processing module sends a signal to the trigger module to switch the switching member (e.g. from a de-energized state to an energized state).

Figure 15A:
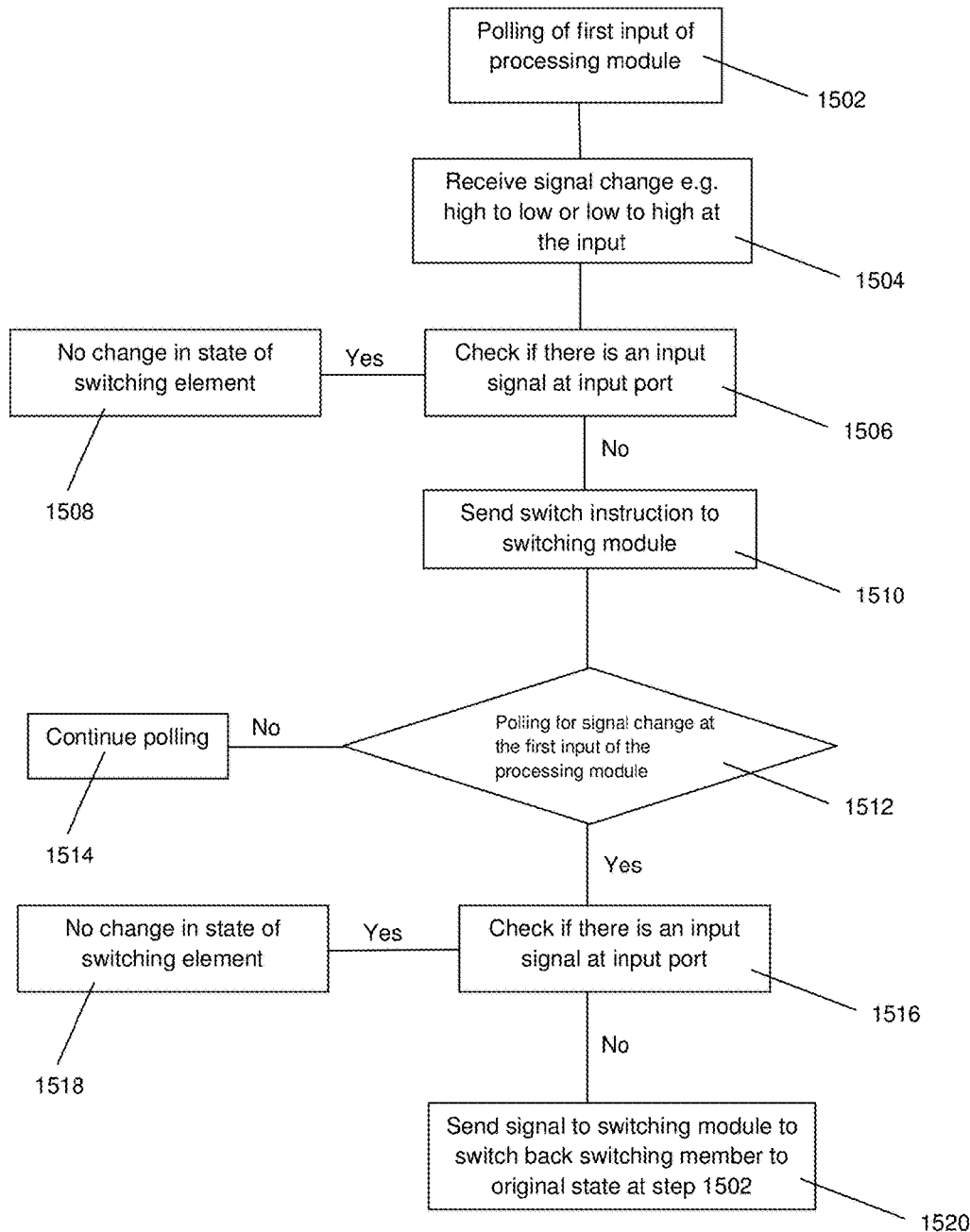
FIG. 15(a) is a schematic flow diagram for illustrating a connectivity test for a solid state relay in an example embodiment.

FIG. 15(*a*) is a schematic flow diagram for illustrating a connectivity test for a solid state relay in an example embodiment. For the ease of illustration and understanding, the solid state relay here does not carry out condition or diagnostics checking as otherwise exemplarily shown in Table 1A.

At step 1502, polling of a first input of a processing module of the relay is conducted. The first input of the processing module is connected to an actuator sampling module of the relay. In alternative example embodiments, the actuator sampling module may be connected directly to a switching module comprising a switching element/member.

At step 1504, a signal change at the first input of the processing module is detected (e.g. from high to ground or from ground to high). This may result from the closing of a contact between a detent switch and an actuator sampling module (e.g. by moving a switch actuator to an up position). Power is provided from an auxiliary power supply. That is, the detent switch receives a mechanical input via the switch actuator.

At step 1506, the processing module conducts a check to determine whether an input signal to the relay via an input port is detected at a second input of the processing module. If the result is yes at step 1506, i.e. there is an input signal at the input port of the relay, the signal change at step 1504 is prevented from causing a switching member/element of the relay to switch state (e.g. from a "switch to connect" state to a "switch to disconnect" state at step 1508). That is, a toggle signal is not sent to the switching module. Such a determination is taken as indicative of an input signal flag being generated at the processing module.

If the result is no at step 1506, i.e. no input signal is sensed at the input port, the processing module sends a logic high signal (e.g. 5V) as a switch instruction (or toggle signal) to a switching module of the relay and the switching module causes a switching member/element to change state (e.g. from a "switch to disconnect" state to a "switch to connect" state at step 1510). The signal change at step 1504 is also taken as indicative of a connectivity test flag being generated at the processing module.

Thereafter, at step 1512, polling for a signal change at the first input of the processing module of the relay continues.

If no signal change is detected at the first input of the processing module of the relay, for example the switch actuator remains in the up position, the polling process continues (at step 1514).

If a signal change is detected at the first input of the processing module of the relay at step 1512, for example the switch actuator is moved from an up position to a down position, the processing module conducts a check to determine whether an input signal to the relay via an input port is detected at a second input of the processing module (at step 1516).

If an input signal is sensed at the second input of the processing module, at step 1518, the signal change at step 1512 is prevented from causing the switching member/element of the relay to switch states. Such a determination is taken as indicative of an input signal flag being generated at the processing module.

If no input signal is sensed at the input port, at step 1520, the processing module sends a signal to the switching module to switch the switching member/element (e.g. from a "switch to connect" state to a "switch to disconnect" state).

Figure 15B:
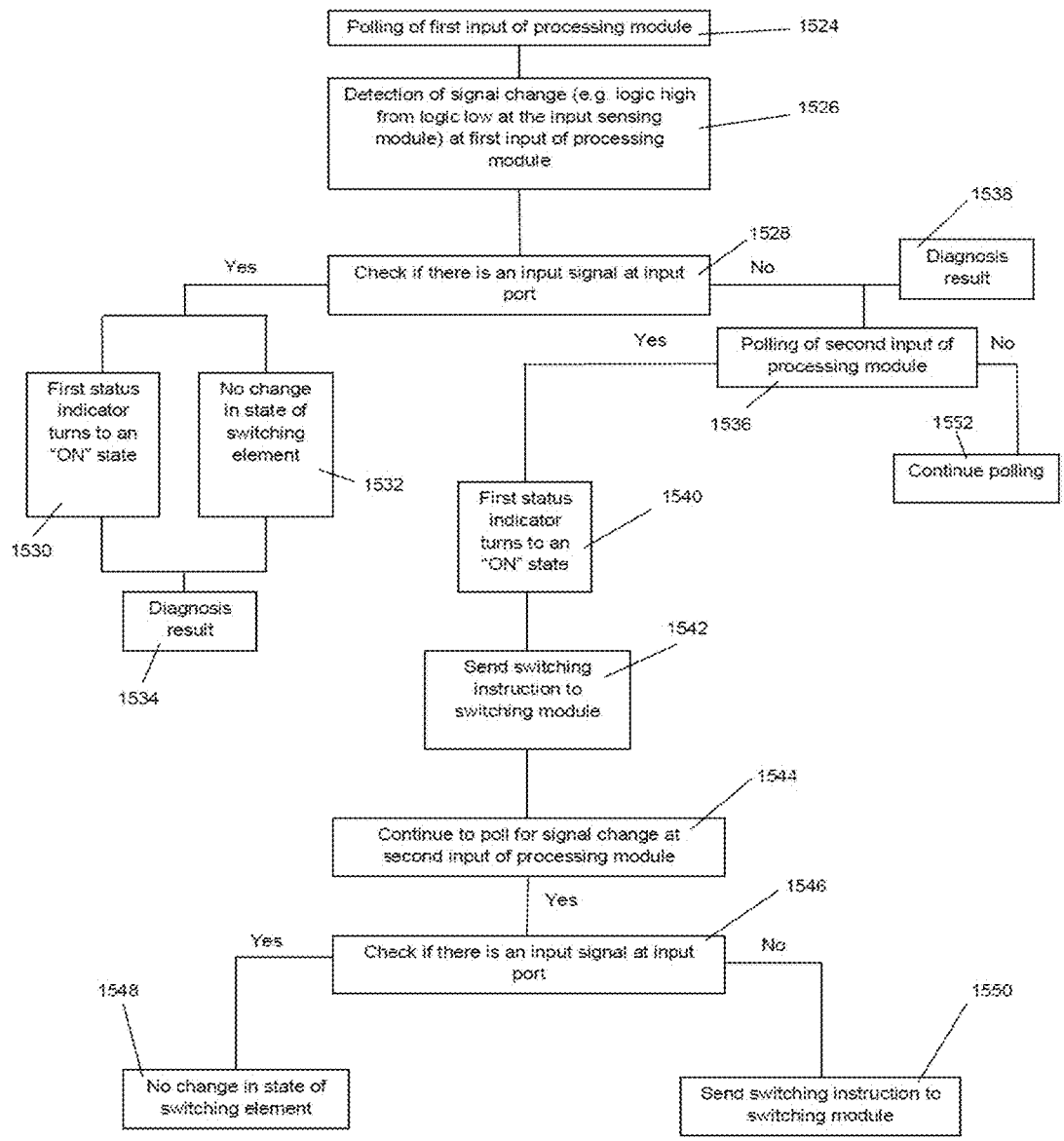
FIG. 15(b) is a schematic flow diagram for illustrating a connectivity test for a solid state relay in another example embodiment.

FIG. 15(b) is a schematic flow diagram for illustrating a connectivity test for a solid state relay that comprises condition or diagnostic checking as exemplarily shown in Table 1A in an example embodiment.

At step 1524, polling of a first input of a processing module of the relay is conducted. The first input of the processing module is connected to an input sensing module of the relay. At step 1526, a signal change at the first input of the processing module is detected (e.g. signal high logic from signal low logic at the input sensing module). This may result from providing signal inputs at input ports of the relay or providing power at an auxiliary power supply. The processing module runs a condition or diagnostics check, such as, for example, those described in numbers 1 to 5 and 11 to 15 of Table 1A.

At step 1528, the processing module conducts a check to determine whether an input signal is detected at the input ports. If an input signal is detected, the first status indicator switches to an "ON" state (at step 1530). The signal change at step 1526 is prevented from causing a switching member/element of the relay to switch state (e.g. from a "switch to connect" state to a "switch to disconnect" state at step 1532). That is, a toggle signal is not sent to the switching module. Such a determination is taken as indicative of an input signal flag being generated at the processing module. The processing module proceeds to provide a diagnostic result of the solid state relay (at step 1534).

If there is no input signal detected at step 1528, polling of a second input of a processing module of the relay is conducted at step 1536. The second input of the processing module is connected to an actuator sampling module of the relay. The processing module proceeds to provide a diagnostic result of the solid state relay (at step 1538).

If no signal change is detected at the second input of the processing module of the relay at step 1536, for example the switch actuator remains in the up position, the polling process continues (at step 1552).

If a signal change at the second input of the processing module is detected (e.g. from high to ground or from ground to high) at step 1536, it is detected that the detent switch receives a mechanical input via the switch actuator. This may result from the closing of a contact between a detent switch and an actuator sampling module (e.g. by moving a switch actuator to an up position). This simulates an input signal which turns the first status indicator to an "ON" state (at step 1540). At step 1542, the processing module sends a signal to the switching module to switch the switching member/element (e.g. from a "switch to disconnect" state to a "switch to connect" state). The processing module sends a logic high signal (e.g. 5V) as a switch instruction (or toggle signal) to a switching module of the relay and the switching module causes a switching member/element to change state (e.g. from a "switch to disconnect" state to a "switch to connect" state at step 1542). The signal change at step 1536 is also taken as indicative of a connectivity test flag being generated at the processing module.

The processing module continues to poll for a signal change at the second input at step 1544. If another signal change at the second input of the processing module is detected (e.g. by moving the switch actuator to a down position), the processing module conducts a check to determine whether an input signal to the relay via an input port is detected at a first input of the processing module (at step 1546).

If an input signal is sensed at the first input of the processing module at step 1546, the signal change at step 1544 is prevented from causing the switching member/element of the relay to switch states (at step 1548). Such a determination is taken as indicative of an input signal flag being generated at the processing module.

If no input signal is sensed at the input port at step 1546, the processing module sends a signal to the switching module to switch the switching member/element (e.g. from a "switch to connect" state to a "switch to disconnect" state). The processing module sends a logic low signal (e.g. 0 V) as a switch instruction (or toggle signal) to a switching module of the relay and the switching module causes a switching member/element to change state (e.g. from a "switch to connect" state to a "switch to disconnect" state at step 1550).

In one example embodiment, a switching device is provided and it comprises a housing; a switching module comprising a switching element, the switching module being configured to switch a state of the switching element upon generation of a condition trigger signal based on one or more predetermined conditions; and an actuator for receiving a mechanical input and for facilitating generation of an electrical toggle signal to the switching module, the toggle signal for instructing the switching module to switch a state of the switching element.

It will be appreciated that a predetermined condition may be an elapsed time period such as a timing period for a timer relay. A predetermined condition may also be a fault detected. In this example embodiment, a condition trigger signal is generated if one or more predetermined conditions are met (e.g. a time period of 15 seconds has elapsed or an overvoltage condition has occurred).

In this example embodiment, the switching module comprises the switching element coupled to a trigger module. The actuator is, for example, a detent switch that may be located internal the switching device. The mechanical input may be received external the switching device at a trigger actuator and translated to the actuator. The trigger actuator extends from an external surface of the housing of the switching device, and is for translating the mechanical input to the actuator. The trigger actuator may be a lever rotatable about the external surface.

In this example embodiment, the electrical toggle signal is generated for sending to the switching module (e.g. the trigger module), by a processing module. Thus, there is facilitated a generation of the toggle signal by the actuator (e.g. in sending a signal level change to a processing module of the switching device).

Alternatively, in another example embodiment, the actuator may be directly coupled to the trigger module and the trigger module has a separate input for a condition trigger signal and another input for a toggle signal. The toggle signal is sent from the actuator based on a signal level change. That is, it may be modified such that the flagging of the fault status and the flagging of the connectivity test may be carried out at the trigger module rather than at the processing module.

In this example embodiment, the signal level change may be generated between a high and a low voltage level (e.g. between a Vcc and a Ground signal) upon receipt of a mechanical input. For example, a detent switch may switch between connection to a Vcc signal or to a ground signal based on whether or not a mechanical force is received.

In this example embodiment, if a condition trigger signal is generated to switch the switching element, the switching module maintains the switch state of the switching element. As described, this functions as a safety feature to prevent a user from switching the state of the switching element if (e.g. a fault has been detected).

In this example embodiment, the switching device further comprises an external cover that is configured to prevent the mechanical input to be applied to the actuator when the external cover is in a closed position with respect to the housing. For example, if a trigger actuator is in the up position, the external cover biases the trigger actuator to a down position to remove the mechanical input to the actuator. The biasing may be via a post provided with the external cover. The cover may also be provided with a latch to maintain the cover in a closed position with respect to the external surface of the switching device.

In one example embodiment, a switching device is provided and it comprises a housing; a switching module comprising a switching member/element, the switching module being configured to switch a state of the switching element upon generation of a switch trigger signal based on a sensing of an input signal at an input port of the switching device; and an actuator for receiving a mechanical input and for facilitating generation of an electrical toggle signal, the toggle signal for causing the switching module to switch a state of the switching element.

It will be appreciated that an input signal may be a logic high or logic low signal. In this example embodiment, a switch trigger signal is generated if an input signal to the relay via an input port is detected at an input of a processing module different from an input of the processing module coupled to the actuator.

In this example embodiment, the switching module comprises the switching member/element coupled to the switching module. The actuator is, for example, a detent switch that may be located internal the switching device. The mechanical input may be received external the switching device at a switch actuator and translated to the actuator. The switch actuator extends from an external surface of the housing of the switching device, and is for translating the mechanical input to the actuator. The switch actuator may be a lever rotatable about the external surface.

In this example embodiment, the electrical toggle signal is generated for sending to the switching module by a processing module. Thus, there is facilitated a generation of the toggle signal by the actuator (e.g. in sending a signal level change to a processing module of the switching device).

Alternatively, in another example embodiment, the actuator may be directly coupled to the switching module and the switching module has a separate input for a switch trigger signal and another input for a toggle signal. The toggle signal is sent from the actuator based on a signal level change. That is, it may be modified such that the flagging of the input signal status and the flagging of the connectivity test may be carried out at the switching module rather than at the processing module.

In this example embodiment, the input signal may be a logic high signal or a logic low signal upon receipt of a mechanical input. For example, a detent switch may switch between connection to an auxiliary power supply or to a ground signal based on whether or not a mechanical force is received.

In this example embodiment, if a switch trigger signal is generated to switch the switching member/element, the switching module maintains the switch state of the switching member/element. As described, this functions as a safety feature to prevent a user from switching the state of the switching element if, for example, a true switching signal has been sent to the switching device.

In this example embodiment, the switching device further comprises an external cover that is configured to prevent the mechanical input to be applied to the actuator when the external cover is in a closed position with respect to the housing. For example, if a switch actuator is in the up position, the external cover biases the switch actuator to a down position to remove the mechanical input to the actuator. The biasing may be via a post provided with the external cover. The cover may also be provided with a latch to maintain the cover in a closed position with respect to the external surface of the switching device.

Figure 9:
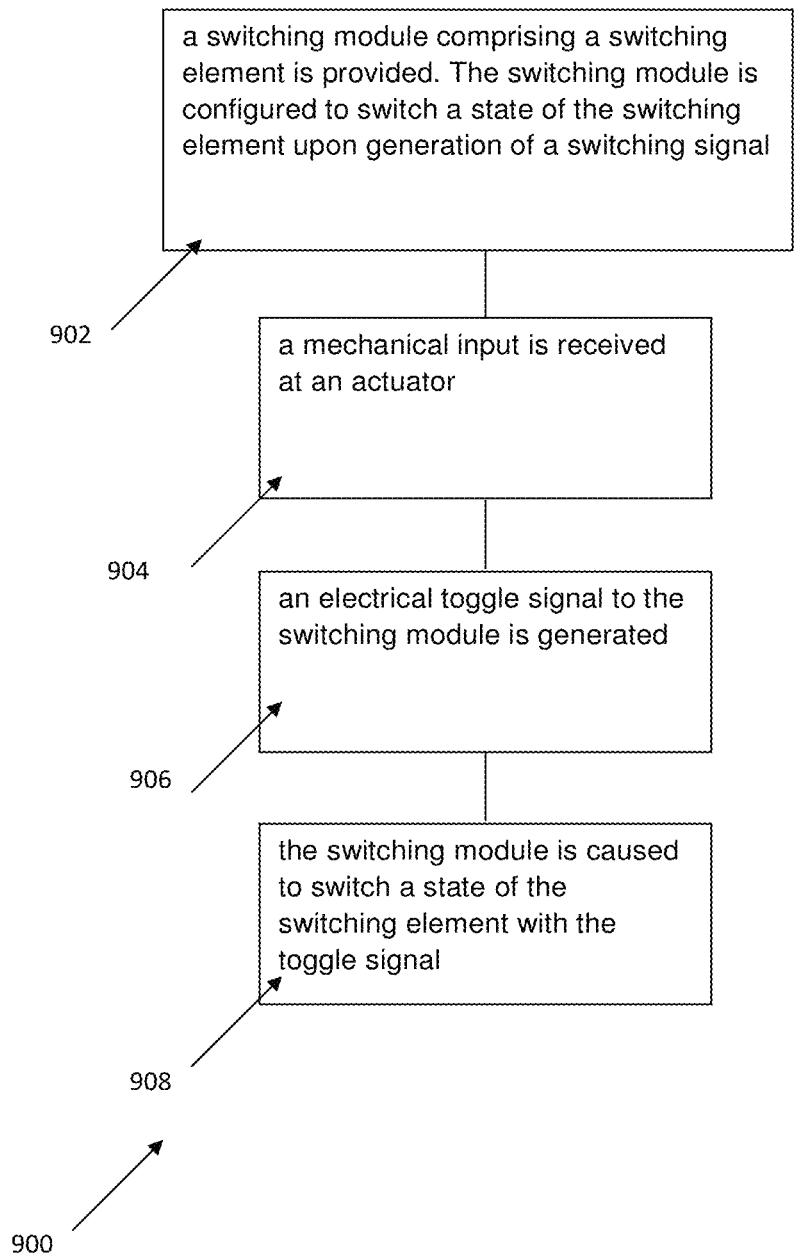
FIG. 9 is a schematic flowchart for illustrating a method for switching states of a switching device in an example embodiment.

FIG. 9 is a schematic flowchart 900 for illustrating a method for switching states of a switching device in an example embodiment. At step 902, a switching module comprising a switching element is provided. The switching module is configured to switch a state of the switching element upon generation of a switching signal. At step 904, a mechanical input is received at an actuator. At step 906, an electrical toggle signal is generated. At step 908, the switching module is caused to switch a state of the switching element with the toggle signal.

In the described example embodiments, a user is allowed to test the quality of connectivity of a relay circuit without having to firstly put the relay circuit into actual operation. The level of safety during a connectivity test is also advantageously improved since a user need not have to actually, for example, send an over-threshold input signal to the relay to conduct a connectivity test on a relay.

Moreover, since a connectivity test may be conducted using individual relays separately, it may also be easier for a user to trouble shoot and pinpoint a particular faulty relay during installation of a relay circuit or when the relay is already put in operation in a relay circuit which typically uses a large number of relays.

Furthermore, the described example embodiments may advantageously prevent a connectivity test from being accidentally conducted on a relay, i.e. from being accidentally switched between states, and hence, affect an electrical circuit when the relay is actively connected to the electrical circuit. This is advantageous over other applications that allow an over-ride button to directly bias and mechanically switch states of a switching member. For example, using a "poka yoke" design element in certain example embodiments, when a cover of a relay is closed, a trigger actuator of the relay is placed/biased into a normal position by default, which advantageously prevents a connectivity test from accidentally being conducted on the relay.

Also, in described example embodiments, a detent switch of a relay may maintain a trigger actuator in an up position for a connectivity test of a relay. This may allow a hands-free operation during a connectivity test. Therefore, a user is able to leave the relay to work on other operations.

Further, the described example embodiments may help to reduce the number of relays which are returned with "no fault found" symptoms, as the relays may be tested before implementation into actual circuits and even before shipment has occurred. This may advantageously help to reduce the costs to a user that may be incurred when replacing or returning such relays.

Furthermore, in the described example embodiments, for relays that have condition triggers relating to fault conditions, using an electrical toggle trigger or switching signal for switching the relays and the safety feature as described, as opposed to allowing a mechanical toggle directly on the switching element, may prevent a user from forcibly switching a relay after a fault has occurred. This may advantageously prevent an electrical circuit connected to a relay from being damaged (e.g. due to over-voltage, over-current, etc.).

In the described example embodiments, the connectivity test may be used to test a relay circuit or electrical circuit that a relay is part of. That is, if certain actions (such as raising an alarm or switching an external load) are to be expected in the event of a condition trigger or a switch trigger, a user may test whether these actions would occur by using a toggle trigger by moving a trigger or switch actuator (or external actuator) of the relay. Advantageously, using a simulated trigger (the toggle signal) to switch the relay, the user need not provide actual over-threshold inputs or connect and control external relay controllers to switch the relay. Such over-threshold inputs may be dangerous to the relay circuits or electrical circuits that the relay is part of. Inconvenience may also be minimized without a need to connect and control external relay controllers.

The terms "coupled" or "connected" as used in this description are intended to cover both directly connected or connected through one or more intermediate means, unless otherwise stated.

The description herein may be, in certain portions, explicitly or implicitly described as algorithms and/or functional operations that operate on data within a computer memory or an electronic circuit. These algorithmic descriptions and/or functional operations are usually used by those skilled in the information/data processing arts for efficient description. An algorithm is generally relating to a self-consistent sequence of steps leading to a desired result. The algorithmic steps can include physical manipulations of physical quantities, such as electrical, magnetic or optical signals capable of being stored, transmitted, transferred, combined, compared, and otherwise manipulated.

Further, unless specifically stated otherwise, and would ordinarily be apparent from the following, a person skilled in the art will appreciate that throughout the present specification, discussions utilizing terms such as "scanning", "calculating", "determining", "replacing", "generating", "initializing", "outputting", and the like, refer to action and processes of an instructing processor/computer system, or similar electronic circuit/device/component, that manipulates/processes and transforms data represented as physical quantities within the described system into other data similarly represented as physical quantities within the system or other information storage, transmission or display devices etc.

In addition, it is submitted that the description also implicitly covers a computer program, in that it would be clear that the steps of the methods described herein may be put into effect by computer code. It will be appreciated that a large variety of programming languages and coding can be used to implement the teachings of the description herein. Moreover, the computer program if applicable is not limited to any particular control flow and can use different control flows without departing from the scope of the disclosed technology.

The example embodiments may also be implemented as hardware modules. A module is a functional hardware unit designed for use with other components or modules. For example, a module may be implemented using digital or discrete electronic components, or it can form a portion of an entire electronic circuit such as an Application Specific Integrated Circuit (ASIC). A person skilled in the art will understand that the example embodiments can also be implemented as a combination of hardware and software modules.

Additionally, when describing some embodiments, the disclosure may have disclosed a method and/or process as a particular sequence of steps. However, unless otherwise required, it will be appreciated the method or process should not be limited to the particular sequence of steps disclosed. Other sequences of steps may be possible. The particular order of the steps disclosed herein should not be construed as undue limitations. Unless otherwise required, a method and/or process disclosed herein should not be limited to the steps being carried out in the order written. The sequence of steps may be varied and still remain within the scope of the disclosure.

Further, in the description herein, the word "substantially" whenever used is understood to include, but not restricted to, "entirely" or "completely" and the like. In addition, terms such as "comprising", "comprise", and the like whenever used, are intended to be non-restricting descriptive language in that they broadly include elements/components recited after such terms, in addition to other components not explicitly recited. Further, terms such as "about", "approximately" and the like whenever used, typically means a reasonable variation, for example a variation of +/−5% of the disclosed value, or a variance of 4% of the disclosed value, or a variance of 3% of the disclosed value, a variance of 2% of the disclosed value or a variance of 1% of the disclosed value.

Furthermore, in the description herein, certain values may be disclosed in a range. The values showing the end points of a range are intended to illustrate a preferred range. Whenever a range has been described, it is intended that the range covers and teaches all possible sub-ranges as well as individual numerical values within that range. That is, the end points of a range should not be interpreted as inflexible limitations. For example, a description of a range of 1% to 5% is intended to have specifically disclosed sub-ranges 1% to 2%, 1% to 3%, 1% to 4%, 2% to 3% etc., as well as individually, values within that range such as 1%, 2%, 3%, 4% and 5%. The intention of the above specific disclosure is applicable to any depth/breadth of a range.

It will be appreciated by a person skilled in the art that other variations and/or modifications may be made to the specific embodiments without departing from the scope of the disclosed technology as broadly described. The present embodiments are, therefore, to be considered in all respects to be illustrative and not restrictive.

For example, in the description herein, an up position and a down position of a trigger actuator may be interchangeable. For example, a trigger or switch actuator may be configured to be in an up position to actuate a manual switching of a relay, and a down position when the trigger or switch actuator is not in a use mode. Conversely, a trigger or switch actuator may be configured to be in a down position to actuate a manual switching of a relay, and an up position when the trigger or switch actuator is not in a use mode.

Furthermore, in the description herein, an energized state of a switching member of a relay is not limited to when a contact of the switching member is switched to connect to a normally open (NO) contact, and a de-energized state of the switching member of the relay is not limited to when the contact of the switching member is switched to connect to a normally closed (NC) contact. For example, an energized state of a switching member may occur when a contact of the switching member is switched to connect to a normally closed (NC) contact, and a de-energized state of the switching member of the relay may occur when the contact of the switching member is switched to connect to a normally open (NO) contact.

Further, in the description herein, a "switch to connect" state of a switching member/element of a solid state relay is not limited to when an input signal is detected at an input port of the relay, and a "switch to disconnect" state of the switching member/element of the solid state relay is not limited to when an input signal is not detected at the input port of the relay. For example, a "switch to connect" state of a switching member/element may occur when an input signal is not detected at the input port of the relay, and a "switch to disconnect" state of the switching member/element of the solid state relay may occur when an input signal is detected at the input port of the relay.

Moreover, in the description herein, a signal level change by an actuator (such as the detent switch) to signal to a processing module in some example embodiments, or directly to a switching module in other example embodiments, to generate a toggle trigger signal is not limited to a change in signal from a logic high signal (e.g. 3V, 5V or Vcc) to ground or from ground to a logic high signal (e.g. 3V, 5V or Vcc). Rather, it may be modified such that any change in a signal level may facilitate the generation of the toggle trigger signal.

What is claimed is:

1. A switching device, the switching device comprising,
a housing;
a processing module;
a switching module including a switching element and a trigger module configured to actuate the switching element, wherein the switching module is configured to switch a state of the switching element upon generation of a switching signal; and
an actuator configured to receive a mechanical input and generate a signal level change between a high voltage level and a low voltage level responsive to receipt of the mechanical input, wherein generating the signal level change facilitates generation of an electrical toggle signal, and wherein the electrical toggle signal causes the switching module to switch a state of the switching element,
wherein the processing module is configured to:
receive the electrical toggle signal;
read the electrical toggle signal; and
issue, responsive to receiving the electrical trigger signal, a switching trigger signal to activate the trigger module, the switching trigger signal indicating the state of the switching element.

2. The switching device of claim 1, wherein the switching signal is a condition trigger signal based on one or more predetermined conditions.

3. The switching device as claimed in claim 1, wherein the toggle signal is sent directly to the switching module.

4. The switching device of claim 2, further comprising a processing module for monitoring the one or more predetermined conditions and generating the condition trigger signal if the one or more predetermined conditions are fulfilled.

5. The switching device of claim 2, further comprising an input sampling module for sampling one or more inputs to the switching device, wherein the one or more predetermined conditions are based on values of the one or more sampled inputs.

6. The switching device of claim 1, wherein the switching signal is a switch trigger signal based on a sensing of an input signal at an input port of the switching device and wherein the switching module is configured to activate an optical element to switch the state of the switching element.

7. The switching device of claim 1, wherein if a switching signal is generated to switch the switching element, the switching module maintains the switched state of the switching element.

8. The switching device of claim 1, further comprising an external actuator extending from an external surface of the housing of the switching device, the external actuator for translating the mechanical input to said actuator for receiving a mechanical input and for facilitating generation of an electrical toggle signal.

9. The switching device of claim 8, wherein the external actuator is a rocker-type actuator rotatable about the external surface.

10. The switching device of claim 8, wherein the external actuator is a lever rotatable about the external surface that comprises a plunger member configured to contact the actuator for translating the mechanical input to the actuator, and the contact is based on a rotation of the external actuator about the external surface.

11. The switching device of claim 1, further comprising an external cover, the external cover configured to prevent the mechanical input to be applied to the actuator when the external cover is in a closed position with respect to the housing.

12. The switching device of claim 11, wherein the external cover further comprises a post.

13. The switching device of claim 11, wherein the external cover further comprises a latch, the latch configured to maintain the external cover in the closed position.

14. The switching device of claim 1, further comprising a status indicator for indicating the state of the switching element.

15. A method for switching states of a switching device, the method comprising,
providing a switching module including a switching element and a trigger module configured to actuate the switching element, the switching module being configured to switch a state of the switching element upon generation of a switching signal;
receiving a mechanical input at an actuator;
generating, responsive to receiving the mechanical input at the actuator, a signal level change between a high voltage level and a low voltage level;
generating, responsive to generation of the signal level change, an electrical toggle signal;
causing the switching module to switch a state of the switching element with the electrical toggle signal,
wherein causing the switching module to switch the state of the switching element includes:
sending the electrical toggle signal to a processing module,
reading, by the processing module, the electrical toggle signal; and
issuing, by the processing module responsive to receiving the electrical toggle signal, a switching trigger signal to activate the trigger module, the switching trigger signal indicating the state of the switching element.

16. The method of claim 15, wherein the generation of the switching signal includes a generation of a condition trigger signal based on one or more predetermined conditions.

17. The method of claim 15, further comprising transmitting the toggle signal directly to the switching module.

18. The method of claim 16, further comprising monitoring the one or more predetermined conditions and generating the condition trigger signal if the one or more predetermined conditions are fulfilled.

19. The method of claim 16, further comprising sampling one or more inputs to the switching device and wherein the one or more predetermined conditions are based on values of the one or more sampled inputs.

20. The method of claim 15, wherein the generation of the switching signal includes a generation of a switch trigger signal based on sensing of an input signal at an input port of the switching device.

21. The method of claim 20, further comprising activating an optical element in the switching module to switch the state of the switching element.

22. The method of claim 20, further comprising monitoring an input signal at an input port and generating the switch trigger signal if a signal change is detected at the input port.

23. The method of claim 15, further comprising maintaining the switched state of the switching element.

24. The method of claim 15, further comprising providing an external actuator extending from an external surface of a housing of the switching device, the external actuator for translating the mechanical input to the actuator.

25. The method of claim 24, wherein the external actuator is a rocker-type actuator rotatable about the external surface.

26. The method of claim 24, wherein the external actuator is a lever rotatable about the external surface and comprises a plunger member configured to contact the actuator for translating the mechanical input to the actuator based on rotating the external actuator about the external surface.

27. The method of claim 15, further comprising providing an external cover, and preventing the mechanical input to be applied to the actuator when the external cover is in a closed position with respect to the housing.

28. The method of claim 27, further comprising providing the external cover with a post.

29. The method of claim 27, further comprising providing the external cover with a latch for maintaining the external cover in the closed position.

30. The method of claim 15, further comprising indicating the state of the switching element with a status indicator.

* * * * *